(12) United States Patent
Eckman

(10) Patent No.: US 11,474,417 B2
(45) Date of Patent: Oct. 18, 2022

(54) LENS HEATER ASSEMBLY FOR CAMERA

(71) Applicant: Lineage Logistics, LLC, Irvine, CA (US)

(72) Inventor: Christopher Frank Eckman, San Francisco, CA (US)

(73) Assignee: Lineage Logistics, LLC, Irvine, CA (US)

( * ) Notice: Subject to any disclaimer, the term of this patent is extended or adjusted under 35 U.S.C. 154(b) by 0 days.

(21) Appl. No.: 16/988,152

(22) Filed: Aug. 7, 2020

(65) Prior Publication Data

US 2022/0043326 A1    Feb. 10, 2022

(51) Int. Cl.
*G03B 17/55* (2021.01)
*H04N 5/225* (2006.01)
(Continued)

(52) U.S. Cl.
CPC ............ *G03B 17/55* (2013.01); *G02B 7/028* (2013.01); *G02B 27/0006* (2013.01); *G03B 17/02* (2013.01); *H04N 5/2252* (2013.01); *H04N 5/2253* (2013.01); *H04N 5/2254* (2013.01); *H04N 5/2257* (2013.01);
(Continued)

(58) Field of Classification Search
CPC ............ H04N 5/2251–2254; H04N 5/22521; H04N 5/2257–2258; H04N 5/2252; H04N 5/2253; H04N 5/2254; G02B 27/0006; G02B 7/008; G02B 7/028; G03B 17/02; G03B 17/08; G03B 17/55;
(Continued)

(56) References Cited

U.S. PATENT DOCUMENTS

| | | | |
|---|---|---|---|
| 9,383,540 B1 * | 7/2016 | Gandhi | .............. H04N 5/23212 |
| 10,588,178 B1 * | 3/2020 | Nelson | .................... H05B 3/146 |
| 2012/0170119 A1 * | 7/2012 | Chu | ........................ G03B 11/00 |
| | | | 359/512 |

(Continued)

FOREIGN PATENT DOCUMENTS

| | | |
|---|---|---|
| CN | 108540702 | 9/2018 |
| EP | 1626583 | 2/2006 |

OTHER PUBLICATIONS

International Search Report and Written Opinion in International Appln. No. PCT/US2021/042061, dated Nov. 29, 2021, 14 pages.

*Primary Examiner* — Twyler L Haskins
*Assistant Examiner* — Akshay Trehan
(74) *Attorney, Agent, or Firm* — Fish & Richardson P.C.

(57) ABSTRACT

In general, one aspect of the subject matter described in this specification can be embodied in an anti-fogging apparatus for a camera assembly. The anti-fogging apparatus includes a camera affixed to a substrate, and a thermally conductive plate, the thermally conductive plate positioned in front of the substrate and defining a first aperture aligned with a lens of the camera. The anti-fogging apparatus includes a transparent plate positioned in front of the thermally conductive plate such that the transparent plate covers said first aperture. The anti-fogging apparatus includes an insulating element positioned in front of the transparent plate and defining a second aperture aligned with the first aperture. The anti-fogging apparatus includes a heating element affixed to the thermally conductive plate. The anti-fogging apparatus includes a case enclosing the camera, the thermally conductive plate, the transparent plate, the insulating element, and the heating element.

19 Claims, 11 Drawing Sheets

(51) Int. Cl.

| | |
|---|---|
| *G02B 7/02* | (2021.01) |
| *G02B 27/00* | (2006.01) |
| *G03B 17/02* | (2021.01) |
| *H05K 1/02* | (2006.01) |
| *H05K 5/00* | (2006.01) |
| *H05K 5/02* | (2006.01) |
| *H05K 7/20* | (2006.01) |
| *G03B 17/08* | (2021.01) |

(52) U.S. Cl.
CPC ....... *H04N 5/2258* (2013.01); *H04N 5/22521* (2018.08); *H05K 1/0212* (2013.01); *H05K 5/0008* (2013.01); *H05K 5/0213* (2013.01); *H05K 7/20* (2013.01); *G03B 17/08* (2013.01); *G03B 2217/002* (2013.01)

(58) Field of Classification Search
CPC ........... G03B 2217/002; H05K 1/0212; H05K 5/0008; H05K 5/0213; H05K 7/20
USPC .......................................................... 359/820
See application file for complete search history.

(56) References Cited

U.S. PATENT DOCUMENTS

| | | | |
|---|---|---|---|
| 2015/0070557 A1* | 3/2015 | Petty | G03B 17/14 |
| | | | 348/333.01 |
| 2015/0264228 A1* | 9/2015 | Grotto | H04N 5/2252 |
| | | | 348/373 |
| 2016/0119509 A1* | 4/2016 | Wato | H04N 5/2257 |
| | | | 348/148 |
| 2016/0231527 A1* | 8/2016 | Tremblay | G01J 5/12 |
| 2016/0277647 A1* | 9/2016 | Adachi | G06K 9/00805 |
| 2016/0334619 A1* | 11/2016 | Nakai | H04N 5/22521 |
| 2017/0099700 A1* | 4/2017 | Chae | H04N 5/2254 |
| 2017/0285335 A1* | 10/2017 | Moncino | G02B 27/0006 |
| 2017/0315427 A1* | 11/2017 | Nakano | H04N 5/2252 |
| 2019/0028617 A1* | 1/2019 | Odom | G03B 17/08 |
| 2019/0056643 A1* | 2/2019 | Chang | H04N 5/2252 |
| 2019/0137723 A1* | 5/2019 | Bernal | H04N 5/2254 |
| 2019/0250363 A1* | 8/2019 | Ha | G03B 17/55 |
| 2019/0381939 A1* | 12/2019 | Rafalowski | G03B 17/55 |
| 2019/0384055 A1* | 12/2019 | Rafalowski | H05K 1/0212 |
| 2020/0084436 A1* | 3/2020 | Patterson | G02B 7/028 |
| 2020/0137277 A1* | 4/2020 | Ichimura | H04N 5/22521 |
| 2020/0159090 A1* | 5/2020 | Liu | G03B 17/55 |

* cited by examiner

LENS HEATER ASSEMBLY FOR CAMERA

TECHNICAL FIELD

This document generally describes an assembly for heating a lens to avoid or mitigate fogging and other visual obstructions.

BACKGROUND

Moving between environments experiencing different environmental conditions, such as differing temperatures, dew points, or humidity levels, can cause a lens to become foggy or experience other visual obstructions. In warehouses and other cold storage facilities, a camera lens can become foggy when moving between warm and cold environments.

SUMMARY

This document generally describes an assembly for heating a camera lens to avoid fogging and other visual obstructions that may occur as the camera lens transitions or moves between different environment conditions, such as differing temperatures, dew points, or humidity levels. The assembly described herein can include an arrangement of heating components to provide a constant defogged state and/or defogging.

In some implementations, a heater assembly can include a camera (e.g., an image sensor), a thermally conductive plate (e.g., aluminum heat distributor plate), a transparent plate (e.g., optically clear acrylic windows) that covers an opening in the thermally conductive plate in which a lens of the camera fits, an insulating element (e.g., silicone seal), a heating element (e.g., heating pad), a thermal switch, a controller, and a case that encloses the heater assembly described herein. The heating element can be attached to the thermally conductive plate and controlled by at least one of the thermal switch and the controller. The heating element can generate heat, based on at least one of temperature values of the transparent plate and external environment conditions, that is transferred to the thermally conductive plate. The heat can be stored in the thermally conductive plate and used to heat the transparent plate to mitigate fogging when the heater assembly moves between different environment conditions.

Positioning the camera inside the case and placing the transparent plate over the camera lens can protect the camera and the camera lens from exposure to any external environment conditions. Additionally, the camera lens can be protected from scratching and direct exposure to fogging, water, dew, etc. As a result, servicing the camera and/or the camera lens can occur less frequently. In some implementations, the insulating element can be positioned on an interior and/or exterior side of the transparent plate to act as a thermal buffer for energy management. The insulating element can insulate the transparent plate from exposure to external temperatures or other environment conditions. One or more fasteners (e.g., screws or bolts) and/or adhesives can be used to couple each of the components described herein to provide for ease of disassembling the assembly and servicing any of the components.

In some implementations, the heating element can be a heat pad. In other implementations, the heating element can include one or more wires positioned around a perimeter of the thermally conductive plate and/or along a front and back surface of the thermally conductive plate. The thermally conductive plate can be manufactured with the heating element attached to or embedded therewithin. In yet other implementations, the heating element can be attached to and/or removed from any portion of the thermally conductive plate, such as a back surface of the thermally conductive plate. In some implementations, the heating element can be attached to the controller.

The thermal switch can provide for thermal control of the heater assembly. The switch can include one or more thermistors. The one or more thermistors can sense real-time temperatures of at least one of an external environment, the transparent plate, and the heating element. The sensed temperature values can be used by the controller to determine how to modulate the heating element so that the heating element provides an adequate amount of heat to the thermally conductive plate to maintain the transparent plate at a constant temperature that avoids fogging. In some implementations, the thermal switch can be configured to couple and decouple the heating element from a power source based upon an instruction from the controller determining whether an adequate amount of heat is generated at the heating element. In other implementations, the thermal switch can be configured to actuate based on temperatures sensed in the external environment. For example, the thermal switch can be configured to couple the heating element to the power source upon sensing a temperature of 55° C. or lower (e.g., a temperature of the heating element, the thermally conductive plate, an environmental temperature inside the case, an environmental temperature outside the case, or combinations thereof.

In some implementations, heat that is distributed and stored on the thermally conductive plate can be transferred to the transparent window and/or the camera (e.g., a camera board). Sometimes, the system can exhibit off-nominal Inertial Measurement Unit (IMU) performance and therefore inaccurate position determination due to low internal temperature. Therefore, transferring generated heat to the camera can improve and/or at least maintain performance of one or more components of the camera.

In some implementations, the heating element can be placed on a front surface of the thermally conductive plate. The thermal switch can be placed on a back surface of the thermally conductive plate. The transparent plate can be positioned on the front surface of the thermally conductive plate to cover the opening (e.g., aperture) in which the camera lens fits. The insulating element can then be positioned over the transparent plate. In other implementations, the thermal switch can be placed on the front surface of the thermally conductive plate. This can allow for easier servicing and/or replacement of the thermal switch. The heating element can be placed on the back surface of the thermally conductive plate. This configuration can be advantageous where the transparent plate is placed on the back surface of the thermally conductive plate because doing so can provide for easier and more direct distribution of heat from the thermally conductive plate to the transparent plate. In yet other implementations, the heating element and the thermal switch can be positioned on the front surface of the thermally conductive plate. This configuration can provide for easier servicing access to the heating element and the thermal switch. This configuration can also be advantageous where the transparent plate is positioned on the front surface of the thermally conductive plate because doing so can provide for easier and more direct distribution of heat from the thermally conductive plate to the transparent plate.

In some implementations, the transparent plate can be positioned on the back surface of the thermally conductive plate. The transparent plate can also be positioned on the front surface of the thermally conductive plate. In yet other implementations, the insulating element can be positioned over the transparent plate and on the front surface of the thermally conductive plate. The insulating element can also be positioned behind the transparent plate, between the transparent plate and the front surface of the thermally conductive plate. In other implementations, the insulating element can be positioned in front of the transparent plate, between the transparent plate and the back surface of the thermally conductive plate. The insulating element can also be attached to the back surface of the thermally conductive plate and the transparent plate can be positioned on the front surface of the thermally conductive plate. Any one or more of the configurations described herein can be modified and/or combined to produce a desired assembly configuration.

In some implementations, the camera can include more than one lenses. In such implementations, a single thermally conductive plate can be used and the plate can include more than one openings (e.g., apertures) for which to fit each of the camera lens. Additionally, the assembly can include more than one insulating element and transparent plate in order to cover each of the camera lens. In yet other implementations, more than one thermally conductive plate can be used in the assembly. In some implementations, the assembly can include more than one heating element. This can be advantageous when the assembly moves between extreme temperature conditions in an external environment and/or the transparent plate covers a larger expanse of space requiring constant heat and defogging.

As additional description to the embodiments described below, the present disclosure describes the following embodiments.

Embodiment 1 is an anti-fogging apparatus for a camera assembly. The anti-fogging apparatus includes a camera affixed to a substrate. The anti-fogging apparatus includes a thermally conductive plate having a back surface facing the substrate and a front surface opposing the back surface, the thermally conductive plate positioned in front of the substrate and defining a first aperture aligned with a lens of the camera. The anti-fogging apparatus includes a transparent plate positioned in front of the thermally conductive plate such that the transparent plate covers said first aperture. The anti-fogging apparatus includes an insulating element positioned in front of the transparent plate and defining a second aperture that is aligned with the first aperture. The anti-fogging apparatus includes a heating element affixed to the thermally conductive plate. The anti-fogging apparatus includes a case enclosing the camera, the thermally conductive plate, the transparent plate, the insulating element, and the heating element.

Embodiment 2 is the apparatus of embodiment 1, further comprising a fastener passing through an opening in the case, an opening in the insulating element, an opening in the transparent plate, and an opening in the thermally conductive plate that align with each other.

Embodiment 3 is the apparatus of embodiment 2, further comprising multiple additional fasteners passing through multiple additional respective openings in the case, multiple additional respective openings in the insulating element, multiple additional respective openings in the transparent plate, and multiple additional respective openings in the thermally conductive plate that align with each other.

Embodiment 4 is the apparatus of any one of embodiments 1-3, wherein the heating element is affixed to the back surface of the thermally conductive plate facing the substrate.

Embodiment 5 is the apparatus of any one of embodiments 1-3, wherein the heating element is affixed to the front surface of the thermally conductive plate.

Embodiment 6 is the apparatus of any one of embodiments 1-5, further comprising a thermal switch affixed to the back surface of the thermally conductive plate facing the substrate.

Embodiment 7 is the apparatus of any one of embodiments 1-5, further comprising a thermal switch affixed to the front surface of the thermally conductive plate.

Embodiment 8 is the apparatus of embodiment 1, wherein the transparent plate abuts the back surface of the thermally conductive plate facing the substrate and the insulating element abuts the front surface of the thermally conductive plate.

Embodiment 9 is the apparatus of embodiment 1, wherein the insulating element abuts the back surface of the thermally conductive plate facing the substrate and the transparent plate abuts the front surface of the thermally conductive plate.

Embodiment 10 is the apparatus of any one of embodiments 1-9, wherein the insulating element is a silicone pad.

Embodiment 11 is the apparatus of any one of embodiments 1-9, wherein the insulating element is a silica desiccant pack.

Embodiment 12 is the apparatus of any one of embodiments 1-11, wherein the heating element is a heating pad.

Embodiment 13 is the apparatus of any one of embodiments 1-12, wherein the thermally conductive plate is aluminum.

Embodiment 14 is the apparatus of any one of embodiments 1-5 and 8-13, further comprising a thermal switch to detect a temperature of the heating element, the thermally conductive plate, or an environment inside the case, the thermal switch coupling and decoupling the heating element to a power source based, at least in part, on the detected temperature of at least the heating element and the ambient environment.

Embodiment 15 is the apparatus of embodiment 14, wherein the thermal switch comprises a first thermistor for detecting a temperature of the heating element and a second thermistor for detecting a temperature of the environment inside the case.

Embodiment 16 is the apparatus of embodiment 14, wherein the thermal switch is affixed to the back surface of the thermally conductive plate with a fastener.

Embodiment 17 is the apparatus of any one of embodiments 1-16, wherein the lens of the camera is positioned within the first aperture in the thermally conductive plate.

Embodiment 18 is an anti-fogging apparatus for a camera assembly. The apparatus includes a camera affixed to a substrate. The apparatus includes a thermally conductive plate having a back surface facing the substrate and a front surface opposing the back surface, the thermally conductive plate positioned in front of the substrate and defining a first aperture aligned with a lens of the camera. The apparatus includes a transparent plate positioned in front of the thermally conductive plate such that the transparent plate covers said first aperture. The apparatus includes an insulating element positioned in front of the transparent plate and defining a second aperture that is aligned with the first aperture. The apparatus includes a heating element affixed to the thermally conductive plate. The apparatus includes a thermal switch affixed to the thermally conductive plate. The apparatus includes a case enclosing the camera, the thermally conductive plate, the transparent plate, the insulating element, and the heating element. The apparatus includes a fastener passing through an opening in the case, an opening in the insulating element, an opening in the transparent plate, and an opening in the thermally conductive plate that align with each other.

The assembly described herein provides one or more advantages. First, the heating element is not directly applied to the camera lens or the transparent plate. Attaching the heating element to the thermally conductive plate can instead make cleaning of the assembly components, such as the camera lens and the transparent plate, easier. This configuration can result in more equal distribution of heat to the transparent plate. Additionally, this configuration can provide for the thermally conductive plate to store generated heat so that the generated heat can be constantly applied to the transparent plate and/or applied at different times when the heating element is not generating heat or not generating a sufficient amount of heat.

Second, positioning the transparent plate on the front surface of the thermally conductive plate and the insulating element on the back surface of the thermally conductive plate can result in easier cleaning of the assembly's components. For example, it can be easier to take apart the assembly and clean the transparent plate when it is affixed or fastened to the front surface of the thermally conductive plate. Placement of the insulating element on the back surface of the thermally conductive plate can also preserve the insulating element from external conditions for longer, such that the insulating element need be less frequently serviced or replaced.

Third, the components of the assembly can be attached to each other using fasteners to provide for easier and faster cleaning and maintenance. For example, using screws, rather than soldering or other forms of joining, to couple components together can make it easier and faster to disassemble the assembly, replace, and/or clean one or more components. Passing all fasteners through a sealed outer shell of the case can also protect components within the case, such as the camera, camera lens, and controller, from being compromised by external environment conditions. Additionally, fasteners can make it easier to separate the case into two halves for servicing access. In some implementations, the thermally conductive plate, heating element, transparent plate, insulating element, thermal switch, and camera can remain fastened to a front panel of the case so that any additional components behind the camera can be easily accessed, serviced, and/or cleaned. In other implementations, the front panel of the case can be unfastened from the heater assembly so that any components attached thereto can be accessed, serviced, and/or cleaned.

Fourth, the thermally conductive plate can create a residual thermal load. Therefore, even if the heater assembly described herein moves to an external environment having a drastically different temperature, dew point, and/or humidity level, energy or generated heat already stored within the thermally conductive plate can be used to maintain the transparent plate at a constant defogged temperature.

Fifth, using the insulating element in the heater assembly can prevent fogging on an inside surface of the transparent plate. The insulating element seals the opening in the thermally conductive plate, which can be covered by the transparent plate, to prevent excess humidity and minimize potential fogging that can occur on the inside of the transparent plate when there is a sudden drop in external temperature. Moreover, sealing the case with the fasteners described herein can further preserve the insulating element so that it can function properly for a longer period of time.

Sixth, the thermal switch may not be soldered or joined to any components of the heater assembly described herein. The thermal switch can be a potential failure point. Therefore, in some implementations, the switch can be fastened to the back surface of the thermally conductive plate. The thermal switch can also be fastened to the front surface of the thermally conductive plate. Attaching the switch to the thermally conductive plate with one or more screws can provide for easier and faster access to the thermal switch in order to service and/or replace the switch.

The details of one or more embodiments are set forth in the accompanying drawings and the description below. Other features and advantages will be apparent from the description and drawings, and from the claims.

DETAILED DESCRIPTION

This document generally describes an assembly for heating a camera lens to avoid fogging and other visual obstructions that may occur as the camera lens transitions between different environment conditions, such as differing temperatures, dew points, or humidity levels.

Figure 1:
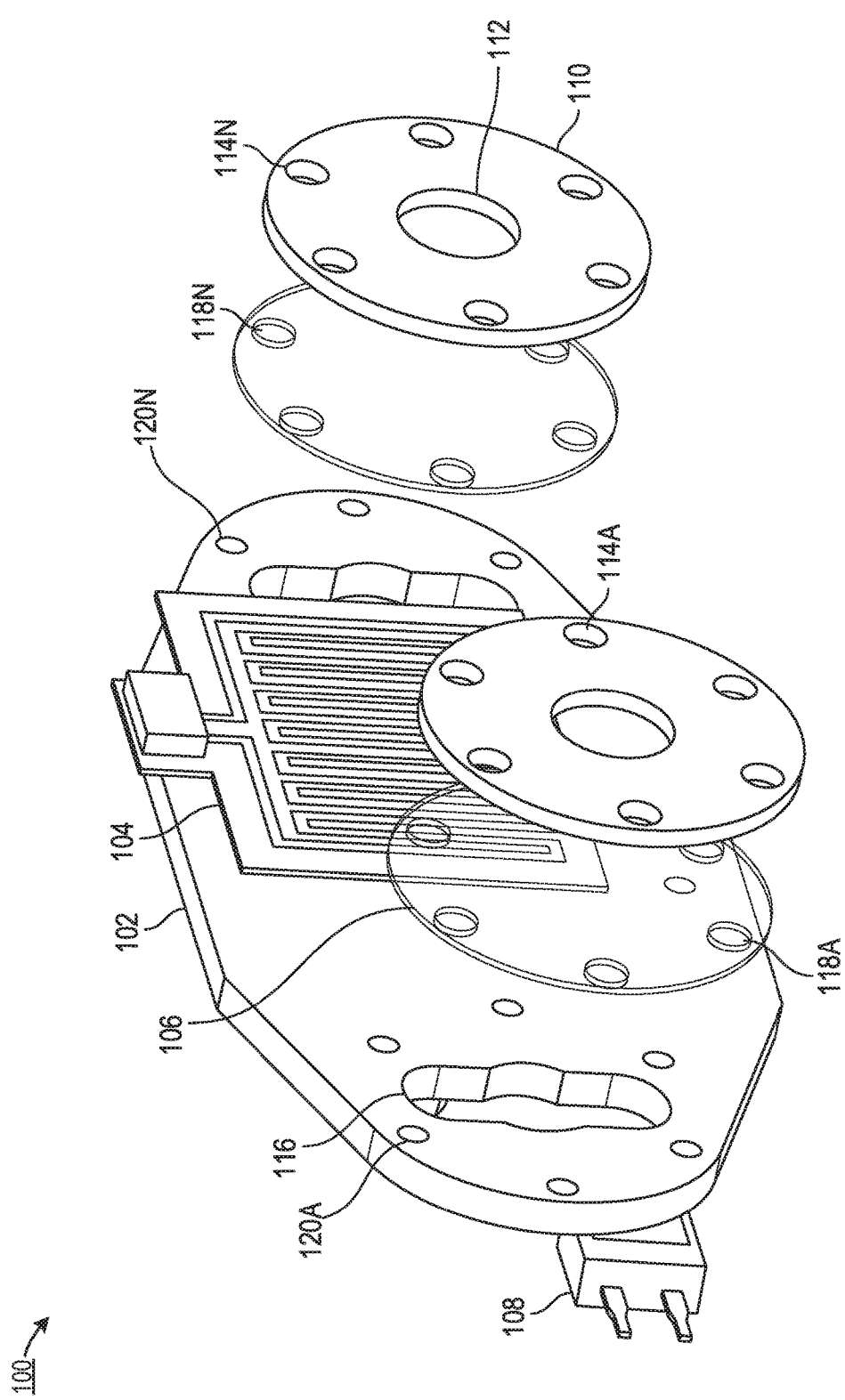
FIG. 1 depicts an exemplary heating subsystem of a heater assembly.

FIG. 1 depicts an exemplary heating subsystem 100 of the heater assembly described herein. The heating subsystem 100 can include a thermally conductive plate 102 (e.g., aluminum heat distributor plate), a heating element 104 (e.g., 6 W patch heater), at least one transparent plate 106 (e.g., optically clear acrylic window), at least one insulating element 110 (e.g., window insulator, seal), and a thermal switch 108. In this exemplary depiction, the thermally conductive plate 102 includes at least one oblong opening 116, or aperture, within which the camera lens fits. The transparent plate 106 can be placed over the opening 116 to cover the camera lens from exposure to external elements or an external environment while still providing for an unobstructed view of the external environment. Additionally, the insulating element 110 can be positioned over the transparent plate 106 to protect the transparent plate 106 from external environment conditions. The insulating element 110 can also be used to maintain atmosphere conditions in the opening 116 once the transparent plate 106 is affixed to the thermally conductive plate 102. The insulating element 110 can include an aperture 112, which is an opening through which the camera lens can view the external environment. Wherever the insulating element 110 is placed in the heating subsystem 100 (e.g., on a back surface of the thermally conductive plate 102, on a front surface of the thermally conductive plate 102 between the plate 102 and the transparent plate 106, on a front surface of the transparent plate 106), the aperture 112 can be aligned with the oblong opening 116 to provide the camera lens with an unobstructed view of the external environment that is external to the case.

As depicted, the insulating element 110 has one or more openings 114A-N, the transparent plate 106 has one or more openings 118A-N, and the thermally conductive plate 102 has one or more openings 120A-N. Each of the openings 114A-N, 118A-N, and 120A-N can be aligned with each other, no matter the order that components of the heating subsystem 100 are assembled in, such that the components 102, 106, and 110 can be securely fastened to each other and held in place. One or more fasteners (e.g., bolts and/or screws) can be used to secure each of the components 102, 106, and 110 to each other in any desired configuration of the heating subsystem 100. In some implementations, one or more adhesives can be used to secure the components 102, 106, and 110 to each other.

Still referring to FIG. 1, the thermal switch 108 can be screwed onto the back surface of the thermally conductive plate 102, as depicted (e.g., refer to FIGS. 4, 7-9). The switch 108 can be configured to decouple or couple the heating element 104 to a power supply such that the heating element 104 can generate and/or stop generating heat. In some implementations, the thermal switch 108 can be a potential failure point due to cycle count. Fastening (e.g., screwing), rather than soldering, the switch 108 to the thermally conductive plate 102 can provide for easier and faster servicing and/or replacement of the thermal switch 108 in the event the switch 108 fails. In yet other implementations, the thermal switch 108 can be screwed onto the front surface of the thermally conductive plate 102 (e.g., refer to FIGS. 5-6). Such a configuration can make it easier to quickly disassemble the heating subsystem 100 and unscrew and/or replace the thermal switch 108, instead of having to detach other components of the heating subsystem 100 or the heater assembly described herein to access the switch 108. In some implementations, the thermal switch 108 can be a Sensata Airpax 67L055 installed using a TO-220 screw-mounted package.

In some implementations, the thermal switch 108 can determine whether power provided by the heating element 104 (e.g., the 6 W patch heater) is insufficient. This determination can be made based on sensing one or more temperatures, by one or more thermistors (e.g., refer to FIG. 11), of the transparent plate 106 and/or the external environment. In some implementations, if power provided by the 6 W patch heater is insufficient to generate enough heat to mitigate fogging on the transparent plate 106, then the thermally conductive plate 102 can be modified to accept a different heating element 104, such as a 40 W ceramic heater cartridge or any other type of heating element that can provide the necessary power to maintain the transparent plate 106 at a temperature to prevent fogging.

As described throughout this disclosure, the transparent plate 106 can be heated to prevent fogging. A sudden rise in temperature in the external environment (e.g., moving the heater assembly, where it was previously chilled, into warmer air with a dew point above a temperature of the transparent plate 106) can cause fogging on an exterior side of the transparent plate 106. To combat this potential fogging, heat can be generated at the heating element 104, stored in the thermally conductive plate 102, and transferred from the thermally conductive plate 102 to the exterior side of the transparent plate 106 at a surface temperature that is high enough to prevent fogging of the exterior side of the plate 106. Fog can also occur on an interior side of the transparent plate 106 when a sudden drop in external environment temperature pulls the interior side of the plate 106 below the dew point of atmosphere inside the heater assembly, and more specifically, between the camera lens, thermally conductive plate 102, and the plate 106. To combat this potential fogging, heat can be generated at the heating element 104, stored in the thermally conductive plate 102, and transferred to the interior side of the transparent plate 106.

In some implementations, chemical anti-fog treatments can optionally be applied across the transparent plate 106 to further mitigate condensation. Such treatments can create a thin layer of hydrophilic material across the transparent plate 106, which can cause any droplets that form on the exterior side of the plate 106 to spread and combine into an invisible thin film of uniform thickness, instead of distortion afforded by the multitude of droplets in fog. This coating does not noticeably impact optical clarity of the camera lens, and can also prevent dust, glare and smudging on the glass.

Still referring to FIG. 1, the heating subsystem 100 includes the insulating element 110 to absorb excess humidity and minimize fogging potential on the interior side of the transparent plate 106. In some implementations, the insulating element 110 can be a seal. The insulating element 110 can include silicone, such as a silica desiccant pack, to remove moisture and limit fogging within the case and condensation on components within the case. As such, there may be no need for an anti-fog coating to an interior surface of the transparent plate 106. In some implementations, the heating subsystem 100 can include more than one insulating element 110 to further minimize fogging of the transparent plate 106. For example, a first insulating element can be positioned between the thermally conductive plate 102 and the transparent plate 106, against a back surface of the transparent plate 106, and a second insulating element can be positioned on a front surface of the transparent plate 106. A configuration having more than one insulating element can be advantageous where the heater assembly moves between extreme environment conditions. Moreover, incorporating the insulating element 110 within the heater assembly rather than on an exterior side of the heater assembly can result in the insulating element 110 functioning properly and lasting for a longer period of time. In some implementations, placing the insulating element 110 on the front surface of the transparent plate 106 can make cleaning and/or replacement of the insulating element 110 easier and faster. After all, a user would not be required to unfasten and remove additional components, such as the transparent plate 106 and the thermally conductive plate 102, in order to access the insulating element 110 and service it.

The exemplary heating subsystem 100 further includes a 6 W patch heater as the heating element 104. Since the heating subsystem 100 is isolated from any external environment, power output requirements are unlikely to increase, and as a result, lower wattage heating elements, like the 6 W patch heater, can be used. The heating element 104 can be fixed directly to the thermally conductive plate 102, on either the front (e.g., refer to FIGS. 4, 6-7, 9) or the back surface (e.g., refer to FIGS. 5, 8) of the plate 102. As depicted in FIG. 1, the heating element 104 is positioned on the front surface of the thermally conductive plate 102, which can facilitate transfer of generated heat from the thermally conductive plate 102 to the interior side of the transparent plate 106 (e.g., refer to FIGS. 4, 6-7, 9). This configuration can also be advantageous to facilitate the transfer of generated heat to the exterior side of the transparent plate 106. Positioning the heating element 104 on the front surface of the thermally conductive plate 102 can also allow for easier access to service, clean, and/or replace the heating element 104. Positioning the heating element 104 on the front surface of the plate 102 can also facilitate more direct and constant heat distribution to the transparent plate 106. More generally, positioning the heating element 104 on a same surface of the thermally conductive plate 102 as the transparent plate 106 can allow for more direct and constant heat distribution (e.g., refer to FIGS. 4, 6, 8-9). In some implementations, the heating element 104 can be a patch heater, a heating pad, and/or one or more wires positioned around a perimeter of the thermally conductive plate 102.

Figure 2:
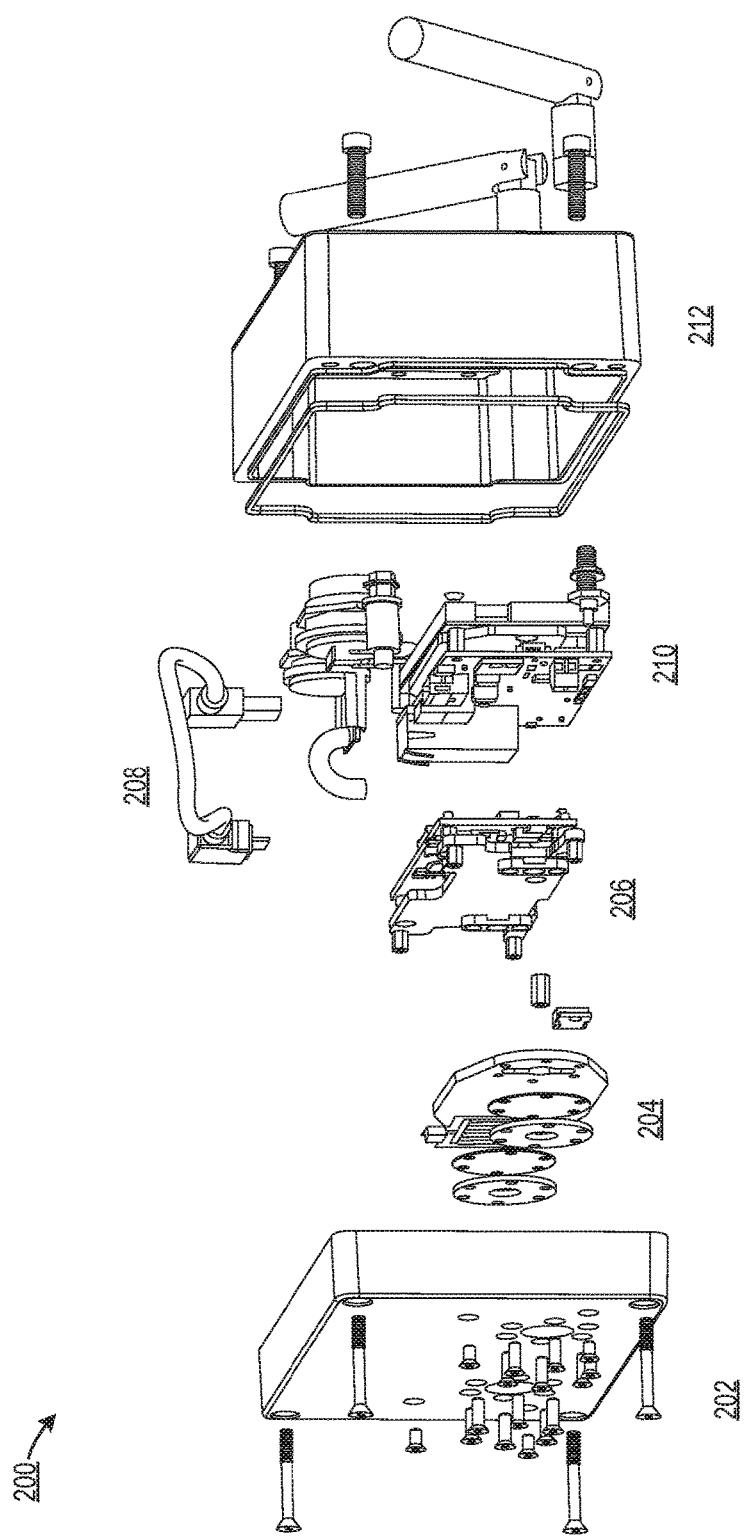
FIG. 2 depicts the heater assembly described herein.

FIG. 2 depicts an exemplary heater assembly 200 as described herein. The heater assembly 200 includes a front panel 202 (e.g., refer to FIG. 3), a heating subsystem 204 (e.g., refer to the heating subsystem 100 in FIG. 1), a camera board 206, a USB 3.0 interface cable 208, a microcontroller 210, and a rear case 212. The camera board 206 can include one or more camera lenses and any electronics/processors required for a camera to function. The microcontroller 210 (e.g., refer to FIGS. 4-9) can be configured to control one or more operations of the heating subsystem 204 (e.g., refer to FIG. 11). A power source, such as a battery (not depicted), can be affixed to the microcontroller 210. In other implementations, the power source can be external to the heater assembly 200 and can be coupled via wires to one or more components of the heater assembly 200, such as the microcontroller 210, the camera board 206, and the thermal switch and/or heating element of the heating subsystem 204 (e.g., refer to FIGS. 4-9).

The front panel 202 and the rear case 212 can be fastened to each other using one or more screws in order to secure the components 204, 206, 208, and 210 of the heater assembly 200 therein. Employing one or more screws, instead of soldering the front panel 202 and the rear case 212 can provide for easier and faster access to components of the heater assembly 200. A layer of insulation (e.g., a rubber or silicone gasket) can be applied around a perimeter of the front panel 202 and the rear case 212 in order to protect and preserve components of the heater assembly 200 from any external environment conditions. The front panel 202 and the rear case 212 can be designed to separate/detach easily for servicing.

In some implementations, the heating subsystem 204 and the camera board 206 can be fixed (e.g., screwed, fastened) to an interior surface of the front panel 202 while the microcontroller 210 can be fixed to an interior side of the rear case 212. This configuration can make it easier for a user to access and service particular components of the heater assembly 200, such as the microcontroller 210. Additionally, attachment of the microcontroller 210 to the interior side of the rear case 212 can maximize cooling potential for one or more components of the microcontroller 210, such as a processor or other electronics. Moreover, the interface cable 208, which connects the camera board 206 to the microcontroller 210 can be easily disconnected to fully separate the front panel 202 from the rear case 212.

In some implementations, at least two hex patterns of M3 countersunk screws or other similar-type fasteners can be used to affix the heating subsystem 204 to the interior surface of the front panel 202. Additionally, a broad pattern of four or more similar screws can be used to secure the camera board 206 to the heating subsystem 204.

In other implementations, the heating subsystem 204 can be fastened to the interior side of the front panel 202 while the camera board 206 and the microcontroller 210 can be fastened to the interior side of the rear case 212. This configuration can be advantageous when servicing or replacing the thermal switch that is screwed onto the back surface of the thermally conductive plate in the heating subsystem 204 (e.g., refer to FIG. 1). Any servicing and/or cleaning of components of the heater assembly 200 can be performed from a single direction to defray costs. For example, if the camera board 206 requires servicing (e.g., cleaning the camera lens), the front panel 202 can be removed and servicing can be performed from that direction. As another example, if the microcontroller 210 needs servicing, then the rear case 212 can be removed so that servicing can be performed from that direction.

Additionally, any of the components 204, 206, 208, and 210 can be detached from each other as well as the front panel 202 and the rear case 212 by unfastening one or more of the fasteners that hold such components together. The use of fasteners makes it easier and faster to service any of the components of the heater assembly 200. Further, in some implementations, one or more layers of an insulating material can be added between the microcontroller 210 and the interior side of the rear case 212. The insulating material can protect electronic components of the microcontroller 210 from any external environment conditions and facilitate cooling of such components, also limiting the magnitude of temperature swings of such components.

Figure 3:
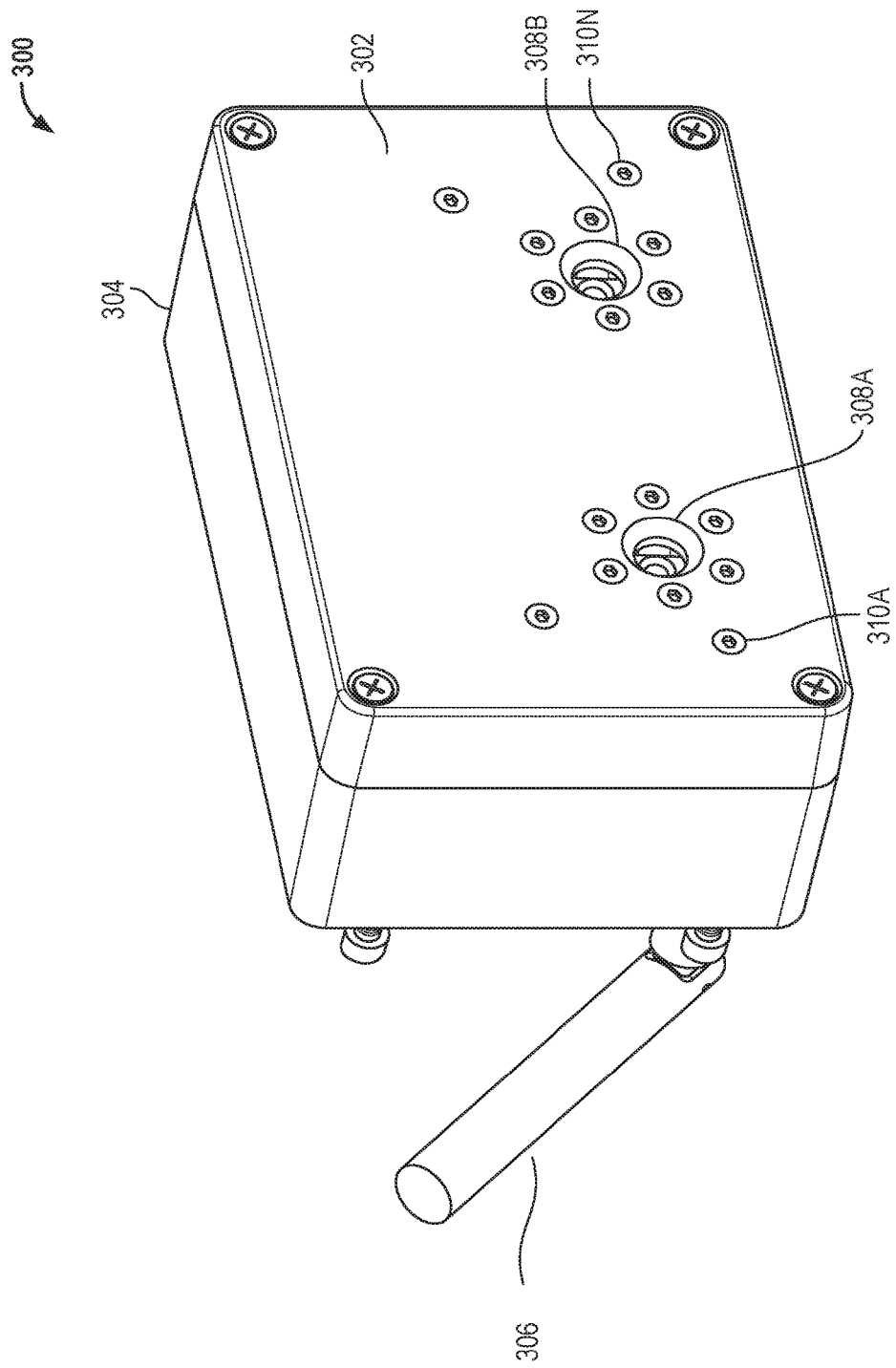
FIG. 3 depicts a perspective view of the heater assembly that shows a front of the heater assembly.

FIG. 3 depicts a perspective view of an assembled heater assembly 300 that shows a front of the heater assembly 300. The heater assembly 300 is the heater assembly 200 as depicted in FIG. 2, when all components are fastened to each other. As depicted, the heater assembly 300 includes a front panel 302 (e.g., refer to the front panel 202 in FIG. 2) and a rear case 304 (e.g., refer to the rear case 212 in FIG. 2). The rear case 304 can optionally include an aperture through which at least one antenna 306 extends.

The front panel 302 includes at least one opening (e.g., aperture) 308A-B by which a camera lens positioned inside the heater assembly 300 can have an unobstructed view of an external environment. In some implementations, the opening 308A-B can be a 10 mm hole, chamfered at 45 degrees to provide an unobstructed field of view for the camera lens. The front panel 302 further includes one or more openings for fasteners 310A-N to affix components of the heater assembly 300 to each other, as described throughout this disclosure. The fasteners 310A-N can pass through the sealed outer front panel 302 and can include integral O-rings so that ingress protection capabilities of the heater assembly 300 are not compromised. In some implementations, M3 countersunk screws can be used to fasten the heating subsystem (e.g., refer to the heating subsystem 100 in FIG. 1 and the heating subsystem 204 in FIG. 2) to the interior surface of the front panel 302. The screws can be positioned in a hex pattern. In some implementations (not depicted), mounting hardware and/or clamp screws to retain the front panel 302 to the rear case 304 can be positioned outside a sealed perimeter of the heater assembly 300.

FIGS. 4-9 depict exemplary configurations of the heater assembly as described throughout this disclosure (e.g., refer to the heating subsystem 100 in FIG. 1, the heater assembly 200 in FIG. 2, and the heater assembly 300 in FIG. 3). The heater assembly depicted in each of the FIGS. 4-9 represents wiring designed in a simplified manner to minimize assembly complexity. Components described herein can be attached to each other with fasteners as described throughout this disclosure. Soldering and/or use of adhesives is not required, which increases ease and efficiency for a user to take apart the heating assembly and service any of the components therein.

Figure 4:
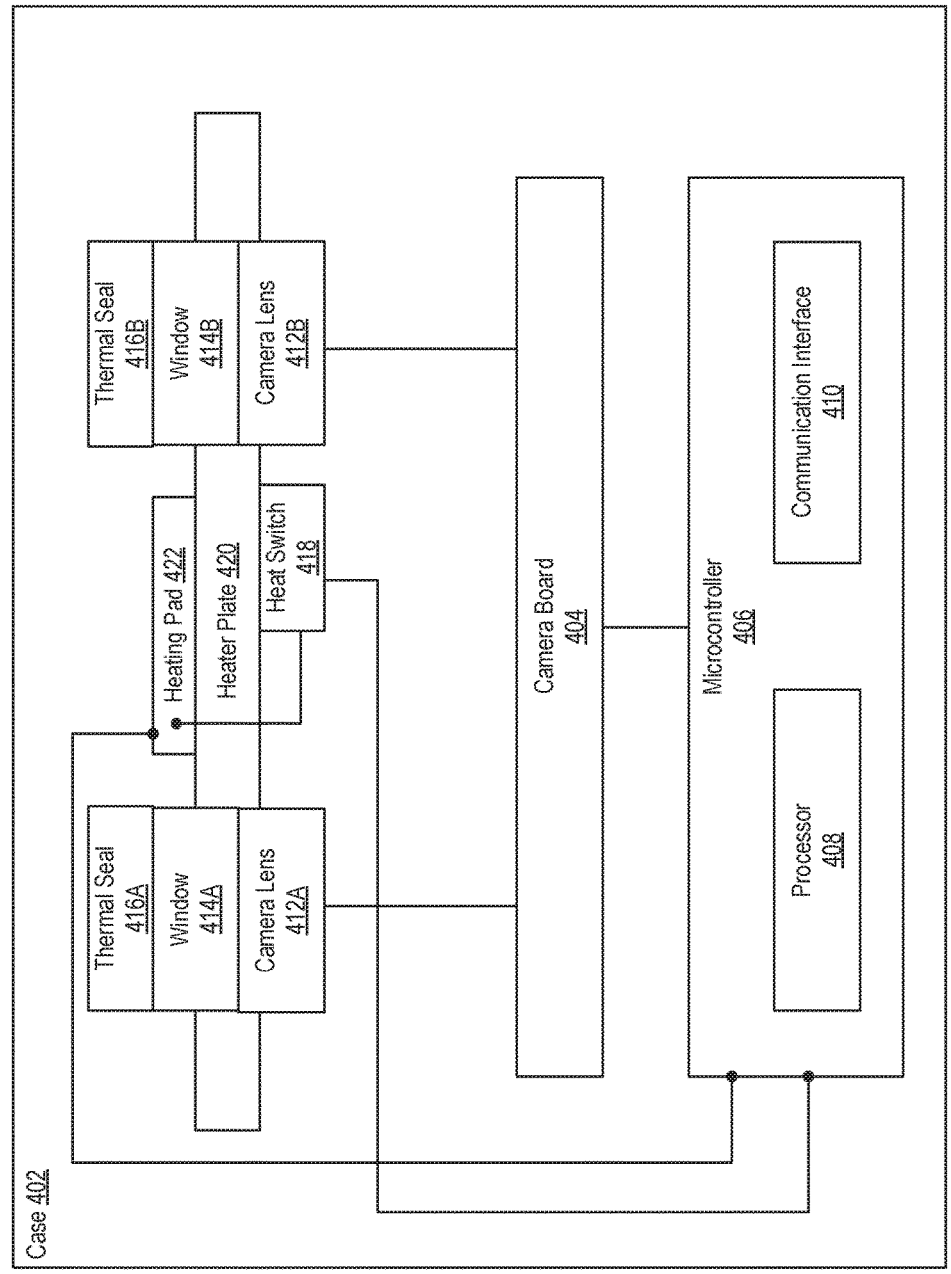
FIGS. 4-9 depict exemplary configurations of the heater assembly.

In FIG. 4, a heater assembly 400 is depicted. As depicted, a case 402 encloses the heater assembly 400 and components therein (e.g., refer to the front panel 202 and the rear case 212 in FIG. 2). The heater assembly 400 includes a camera board 404 (e.g., the camera board 206 in FIG. 2), a microcontroller 406 (e.g., the microcontroller 210 in FIG.

2), a heater plate 420 (e.g., the thermally conductive plate 102 in FIG. 1), and additional components comprising the heating subsystem 100 in FIG. 1 and the heating subsystem 204 in FIG. 2). The heater assembly 400 includes a heating pad 422 (e.g., the heating element 104 in FIG. 1), a heat switch 418 (e.g., the thermal switch 108 in FIG. 1), at least two thermal seals 416A-B (e.g., the insulating element 110 in FIG. 1), and at least two windows 414A-B (e.g., the transparent plate 106 in FIG. 1). The heater assembly 400 further includes at least two camera lenses 412A-B. The microcontroller 406 includes at least a processor 408 and a communication interface 410.

The microcontroller 406 can be electronically coupled to one or more components of the heater assembly 400 by wires that can be easily connected and disconnected. For example, the microcontroller 406 can be in wired communication (e.g., USB) with the heating pad 422 and the heat switch 418. Additionally, the heat switch 418 can be in wired communication with the heating pad 422. The microcontroller 406 can also communicate with one or more components using the communication interface 410. The communication interface 410 can be configured to provide wired communication (e.g., via USB) and wireless communication (e.g., via BLUETOOTH) with other components of the heater assembly 400. In some implementations, the microcontroller 406 can communicate wirelessly with the camera board 404, the heat switch 418, and/or the heating pad 422. A power source (not depicted) can also be configured to the microcontroller 406 and/or external to the case 402. The power source can be configured to provide power to the microcontroller 406, the camera board 404, the heat switch 418, and the heating pad 422.

As depicted, the camera lenses 412A-B are attached to a front portion of the camera board 404. A front surface of camera lenses 412-B can be flush with the camera board 404 as well as a back surface (e.g., interior side) of the heater plate 420 so as to create a sealed environment between the components. The camera lenses 412A-B can fit into oblong openings (e.g., apertures) in the heater plate 420 (e.g., the opening 116 in FIG. 1) such that the camera lenses 412A-B have an unobstructed view of an external environment. The windows 414A-B can then be positioned over the openings in the heater plate 420 on a front surface (e.g., exterior side) of the heater plate 420 to create a sealed environment between the heater plate 420, the camera lenses 412A-B, and the camera board 404. The thermal seals 416A-B can be positioned on a front surface of the windows 414A-B, against an interior side of a front portion (e.g., the front panel 202 in FIG. 2) of the case 402. Additionally, the heating pad 422 can be affixed to the front surface of the heater plate 420, proximate to the windows 414A-B. The heat switch 418 can be placed on the back surface of the heater plate 420. This configuration can be advantageous to provide constant heat to the windows 414A-B in order to keep the windows 414A-B at a steady temperature to avoid fogging as the heater assembly 400 moves between different environment conditions.

The heater plate 420 can be a large piece of thermally conductive material (e.g., metal, aluminum) that creates and maintains a residual thermal load, based on heat generated by the heating pad 422 that is transferred to the heater plate 420. This is advantageous in situations where the heater assembly 400 moves between drastically different environment conditions. The residual thermal load acts as a storage of more energy/heat that can be applied to the windows 414A-B during such extreme conditions. As a result, whether or not the heating pad 422 can generate a sufficient amount of heat to defog or prevent fogging of the windows 414A-B during such conditions, stored heat at the heater plate 420 can maintain the windows 414A-B at a constant, defogged temperature. The heater plate 420 may be manufactured in different sizes for storing different (e.g., greater or lesser) amounts of generated heat. This configuration is also beneficial to maintain the windows 414A-B at a constant temperature to avoid fogging in any environment condition. Moreover, placement of the heating pad 422 on the heater plate 420 is beneficial so that a heating element does not need to be placed directly on or near the camera lenses 412A-B. Placement of a heating element directly on the camera lenses 412A-B can cause damage to the camera lenses 412A-B, make servicing and maintenance more challenging, and/or result in unequal distribution of heat to the camera lenses 412A-B.

As described throughout this disclosure, the heat switch 418 can include at least one thermistor configured to sense a temperature of at least one of the windows 414A-B and an external environment. In some implementations, the heat switch 418 can sense real-time temperatures of the heating pad 422 in order to adjust how much heat should be generated by the heating pad 422. The heat switch 418 can optionally be positioned inside the heating pad 422 in order to sense more accurate temperature values of the heating pad 422. The heat switch 418 can sense the temperatures of each of the windows 414A-B in real-time, then transmit those temperature values to the microcontroller 406. The processor 408 can determine whether the windows 414A-B are at a preferred temperature in order to avoid or mitigate fogging (e.g., refer to FIG. 11). Depending on the processor 408's determination, information can be transmitted back to the heat switch 418, instructing the heat switch 418 to couple and/or decouple the heating pad 422 with the power source and/or the microcontroller 406. For example, when the temperatures of each of the windows 414A-B is too high (e.g., above a predetermined threshold value), the heat switch 418 can be instructed to decouple the heating pad 422 with the power source and/or the microcontroller 406 to turn off or prevent the heating pad 422 from generating heat. In other examples, when the temperatures of each of the windows 414A-B is too low, the heat switch 418 can be instructed to couple the heating pad 422 with the power source and/or the microcontroller 406 to turn on the heating pad 422 and/or cause it to generate heat.

Still referring to FIG. 4, if the heat switch 418 couples the heating pad 422 to the power source and/or the microcontroller 406, then the heating pad 422 can generate heat or increase an amount of heat currently being generated. This can be advantageous when the heater assembly 400 moves from one external environment to another experiencing different environment conditions, such as humidity levels, dew points, and/or temperature (e.g., going from a cold environment to a warm environment). Power to generate heat can therefore be supplied to the heating pad 422 by at least one of the power source and the microcontroller 406.

In some implementations, heat produced at the microcontroller 406 due to processing can be transferred to the heating pad 422. As a result, coupling to a power source may not be required. Additionally, the processor 408 or other components of the microcontroller 406 can be cooled if heat generated at the microcontroller 406 is redirected to the heating pad 422 and/or the heater plate 420. If the heat switch 418 decouples the heating pad 422 to the power source and/or the microcontroller 406, then the heating pad 422 does not generate additional heat and/or stops generating heat. This would be advantageous when the heater assembly 400 is in a constant external environment. In some implementations, one or more thermistors of the heat switch 418 can be configured to sense real-time temperatures of the external environment. Those temperature values can also be used by the processor 408 in order to determine how much heat should be generated by the heating pad 422.

The heating pad 422 (e.g., the heating element 104 in FIG. 1) can be configured to convert electrical signals into heat. As mentioned, the electrical signals can be transmitted from the microcontroller 406 and/or the heat switch 418. The heating pad 422 can be affixed to, embedded in, or part of the heater plate 420. In some implementations, the heater plate 420 can be manufactured with the heating pad 422. In other implementations, the heating pad 422 can be easily added onto the heater plate 420 and a user can swap out or replace the heating pad 422 with other heating elements at any times and in any environment conditions. Once the heating pad 422 generates heat as described throughout this disclosure, the heat transfers from the heating pad 422 to the heater plate 420.

The heater assembly 400 is a beneficial configuration for easy and quick servicing of components. For example, placement of the thermal seals 416A-B on a front surface of the windows 414A-B and on the interior side of the front panel of the case 402 allows for easy and fast access of the thermal seals 416A-B if they need to be replaced. Placement of the windows 414A-B on the front surface of the heater plate 420 also makes the windows 414A-B easily accessible for cleaning and/or replacement. Placement of the heating pad 422 on the front surface of the heater plate 420 makes the heating pad 422 easily accessible for replacement. For example, if a user seeks to apply more heat to the windows 414A-B to compensate for extreme environment conditions, the user may need to replace an existing, lower wattage heating pad 422 with a higher wattage heating pad 422. The user can disassemble the case (e.g., refer to FIG. 2) and easily and quickly swap out the heating pad 422. Ease of access to components of the heater assembly 400 allows the user to swap out, service, or change such components. As described throughout this disclosure, screwing, rather than soldering, the heat switch 418 to the back surface of the heater plate 420 allows for easier and faster maintenance of the heat switch 418. Since the heat switch 418 can be a failure point, ease of access is advantageous.

Figure 5:
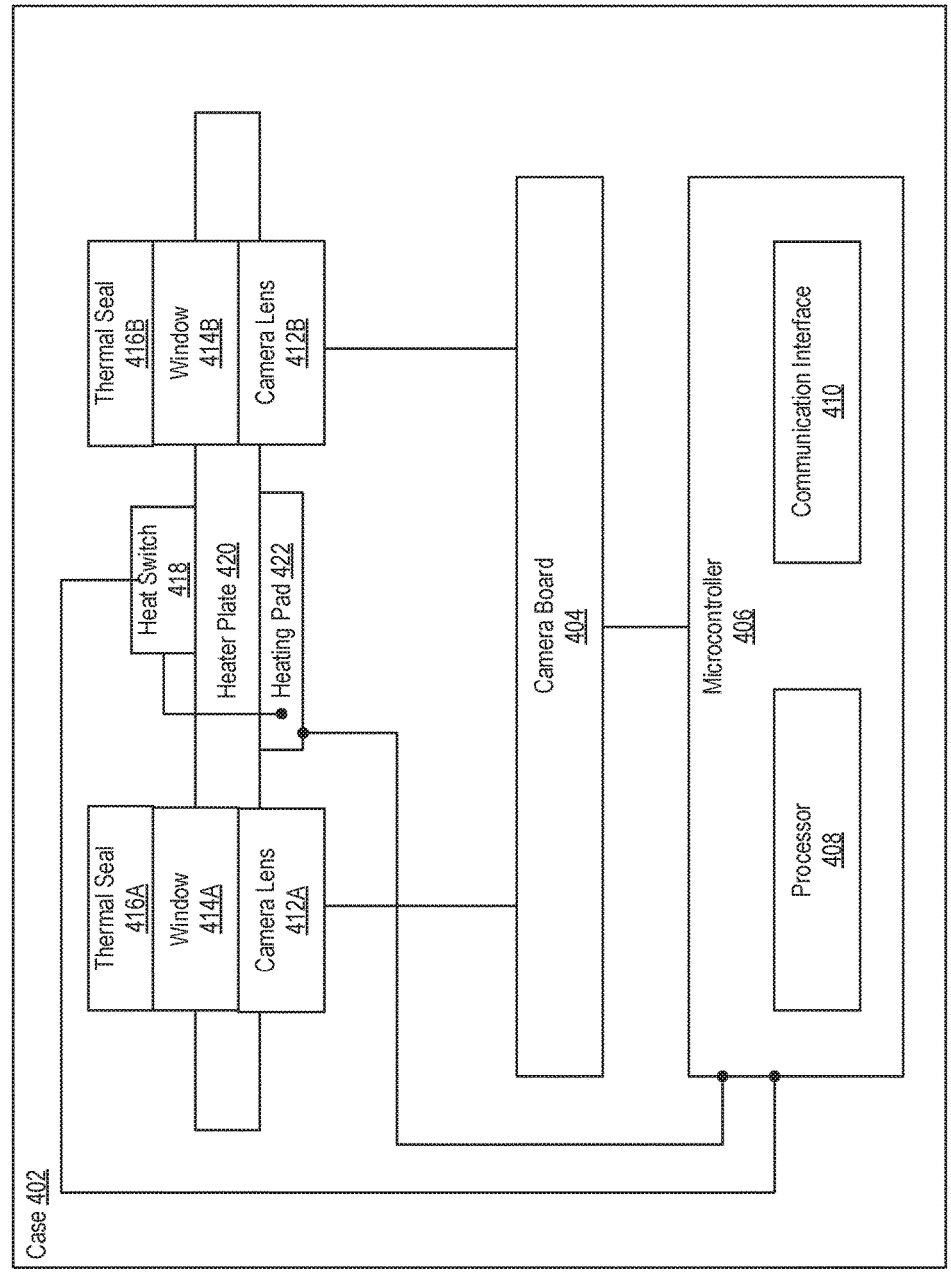

FIG. 5 depicts a heater assembly 500. The heater assembly 500 performs/functions similarly and compromises the same components as described throughout this disclosure (e.g., refer to FIG. 4). In the heater assembly 500, the heating pad 422 is attached to the back surface of the heater plate 420 and the heat switch 418 is attached to the front surface of the heater plate 420. This configuration can be advantageous for several reasons. First, placement of the heat switch 418 on the front surface of the heater plate 420 can provide for easier and faster servicing of the heat switch 418. Second, placement of the heating pad 422 on the back surface of the heater plate 420 can provide for more distributed and even heat transfer to the heater plate 420 and to the windows 414A-B, especially on an interior side of the windows 414A-B. Third, the heater assembly 500 can be preferred in situations where the heater assembly 500 moves through environments that have somewhat moderate environment conditions, In other words, those environments do not shift dramatically between different temperatures, dew points, and/or humidity levels. As a result of the configuration depicted in FIG. 5, the windows 414A-B can be maintained at a constant temperature to avoid fogging, no matter the surrounding environment conditions.

Still referring to FIG. 5, heat generated by the heating pad 422 can be transferred through the back surface of the heater plate 420 and to the interior side of the windows 414A-B. Heat can also be transferred through the front surface of the heater plate 420 and to an exterior side of the windows 414A-B. In some implementations, heat can be equally transferred to both the interior and exterior sides of the windows 414A-B simultaneously, such that interior and exterior fogging can be mitigated. In some implementations, enough heat can be generated such that heat mainly or only transfers to the interior side of the windows 414A-B. The configuration depicted in FIG. 5 is advantageous to prevent fogging on the interior side of the windows 414A-B whenever a sudden drop in external temperature causes the interior side of the windows 414A-B to go below a dew point of an atmosphere between the windows 414A-B and the camera lenses 412A-B. Constant heat applied to the interior side of the windows 414A-B can maintain the dew point as low as possible to prevent fogging therein. The heater assembly 500 can prove advantageous in different situations, whether the purpose of the heating subsystem is to reduce or mitigate fogging on the interior side of the windows 414A-B and/or on the exterior side of the windows 414A-B. Moreover, the heater assembly 500 can be reconfigured into the heater assembly 400 or any other heater assembly described herein (e.g., refer to FIGS. 6-9).

Figure 6:
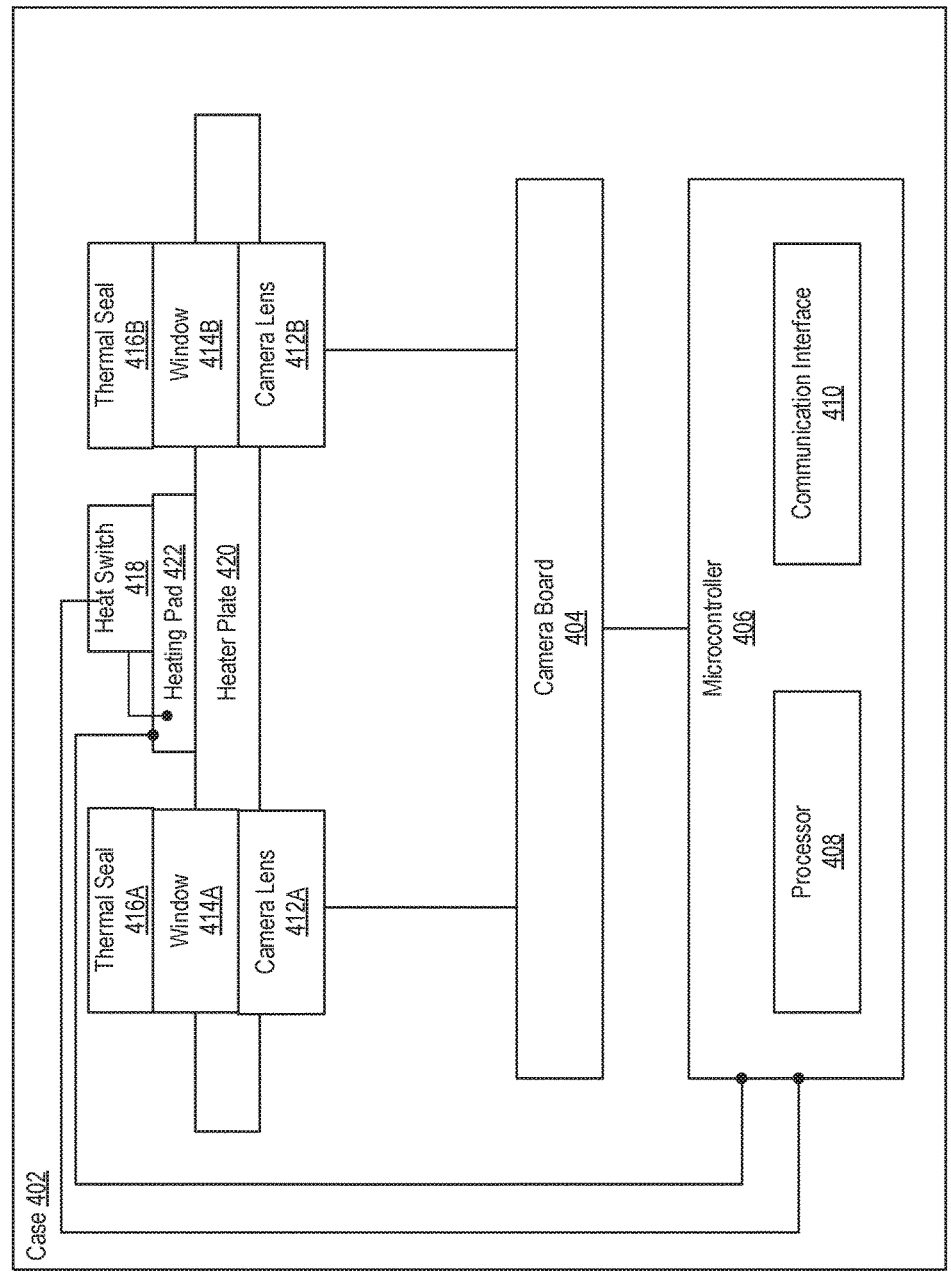

In FIG. 6, a heater assembly 600 is depicted. The heater assembly 600 performs/functions similarly and compromises the same components as described throughout this disclosure (e.g., refer to FIG. 4). In the heater assembly 600, the heating pad 422 and the heat switch 418 are positioned on the front surface of the heater plate 420. In some implementations, the heat switch 418 can be affixed directly to the heating pad 422, as depicted. In other implementations, the heat switch 418 can be affixed directly to the heater plate 422, proximate to the heating pad 422. The heat switch 418 can be attached directly to the heating pad 422 to sense more accurate readings of real-time temperature values of the heating pad 422 and/or the windows 414A-B. This configuration can also be advantageous because the heat switch 418 is closer to the external environment outside the case 402 and can sense more accurate readings of real-time temperature values of the external environment. Placement of the heat switch 418 on the front surface of the heater plate can also make it easier and more efficient for servicing the switch 418. As previously mentioned (e.g., refer to FIG. 4), placement of the heating pad 422 on the front surface of the heater plate 420 can be advantageous for at least two reasons. First, this configuration can allow for constant heat to be transferred to the windows 414A-B from the heater plate 420. Second, this configuration can allow for easier and more efficient servicing, maintenance, and/or replacement of the heating pad 422. Moreover, the heater assembly 600 can be reconfigured into the heater assembly 400, 500, or any other heater assembly described herein (e.g., refer to FIGS. 7-9).

Figure 7:
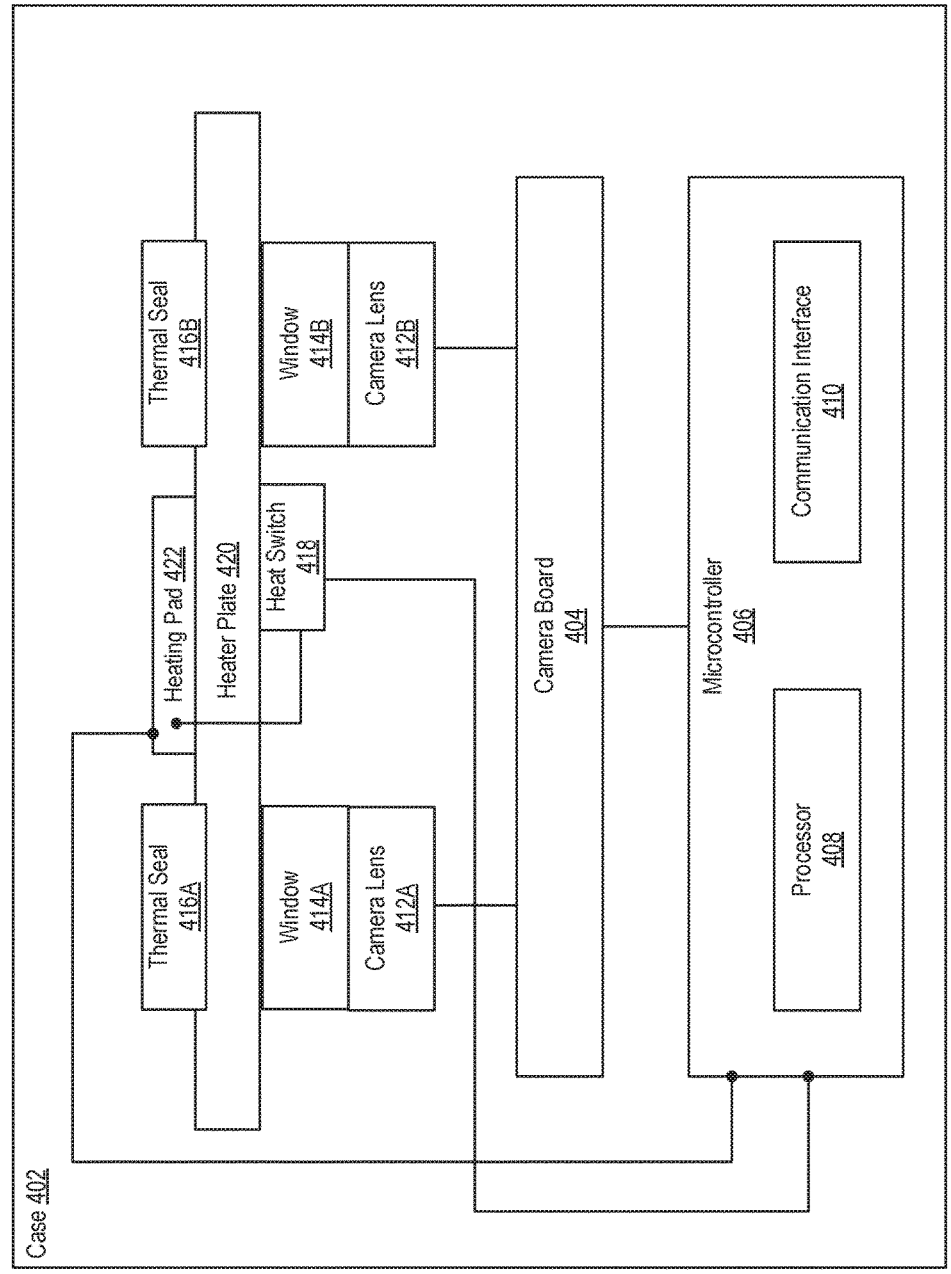

FIG. 7 depicts a heater assembly 700. The heater assembly 700 performs/functions similarly to and compromises the same components as various implementations described throughout this disclosure (e.g., refer to FIG. 4). In the heater assembly 700, the windows 414A-B are positioned on the back surface of the heater plate 420, between the back surface of the heater plate 420 and the camera lenses 412A-B, thereby creating a smaller sealed environment. The thermal seals 416A-B are affixed directly to the front surface of the heater plate 420 to provide a thermal buffer between the components behind the heater plate 420, the case 402, and the external environment. As depicted, the heating pad 422 is positioned on the front surface of the heater plate 420 and the heat switch is screwed onto the back surface of the heater plate 420. In some implementations (not depicted), both the heating pad 422 and the heat switch 418 can be positioned on the front surface of the heater plate 420. In other implementations (not depicted), the heating pad 422 can be positioned on the back surface of the heater plate 420 and the heat switch 418 can be positioned on the front surface of the heater plate 420.

Still referring to FIG. 7, the heater assembly 700 can be advantageous for several reasons. First, direct placement of the windows 414A-B over the camera lenses 412A-B can reduce potential buildup of dust or other particles, which can obstruct a view of the camera lenses 412A-B, on the interior side of the windows 414A-B. As a result, the need for cleaning and servicing the windows 414A-B can be reduced. Second, placement of the windows 414A-B against the back surface of the heater plate 420 can reduce potential exposure of the windows 414A-B to external environment conditions, thereby reducing a potential for fogging as the heater assembly 500 moves between different environments. Third, placement of the thermal seals 416A-B against the front surface of the heater plate 420 can make it easier and faster to service or replace the thermal seals 416A-B. Fourth, placement of the thermal seals 416A-B against the front surface of the heater plate 420 can further increase thermal buffering between the windows 414A-B and the external environment, thereby reducing potential fogging of the windows 414A-B. Fifth, because of increased thermal buffering between the windows 414A-B and the external environment, the heating pad 422 can be configured to output less heat, thereby requiring less power/wattage, in order to maintain the windows 414A-B at a constant condition. Sixth, because the heating pad 422 can be configured to output less heat, the heating pad 422 can last longer and can require less frequent servicing, maintenance, or replacement. Other advantages are apparent based on the description throughout this disclosure. Moreover, the heater assembly 700 can be reconfigured into the heater assembly 400, 500, 600, or any other heater assembly described herein (e.g., refer to FIGS. 8-9).

Figure 8:
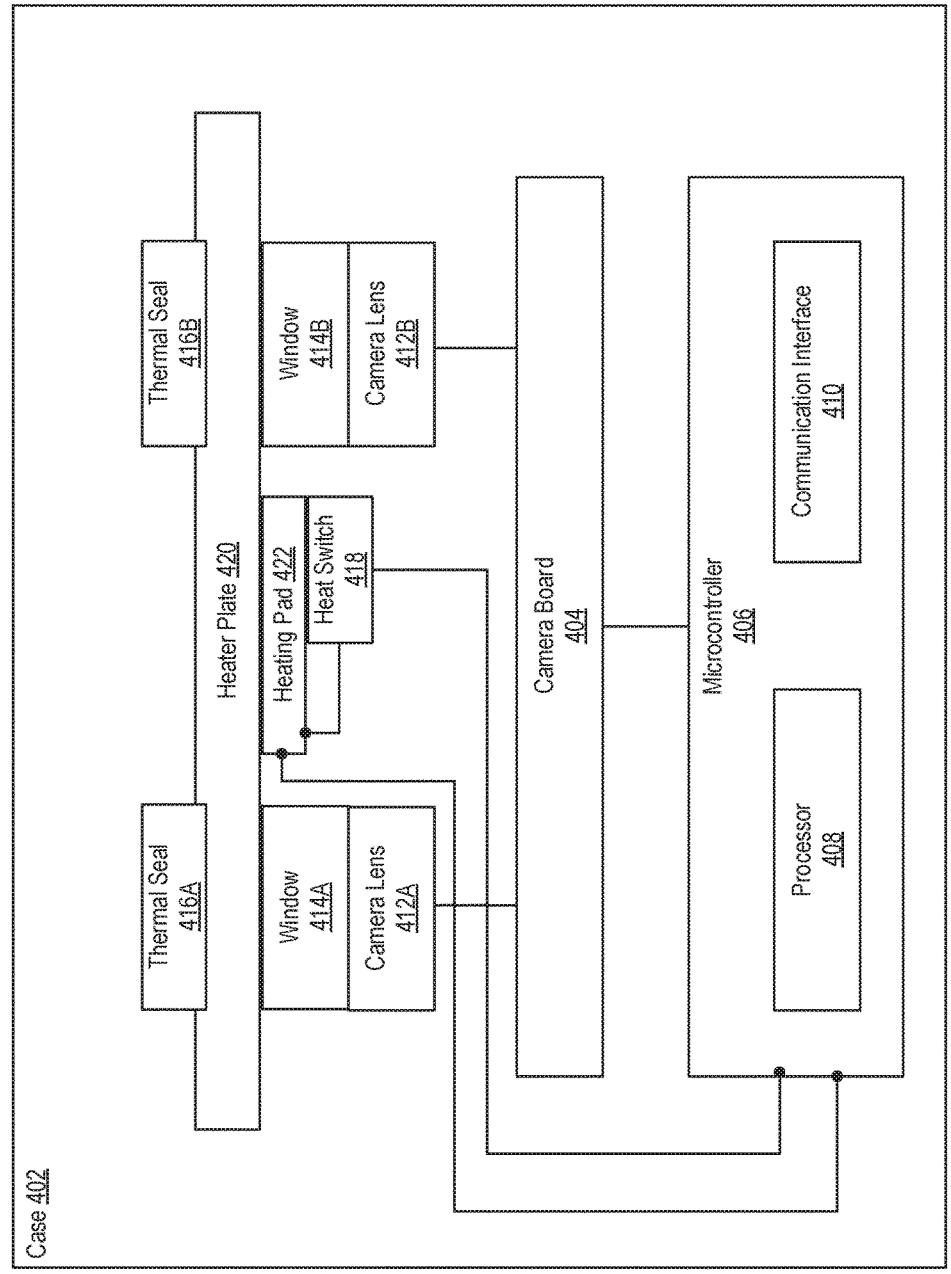

FIG. 8 depicts a heater assembly 800. The heater assembly 800 performs/functions similarly and compromises the same components as described throughout this disclosure (e.g., refer to FIG. 4). In the heater assembly 800, the windows 414A-B are positioned on the back surface of the heater plate 420, between the back surface of the heater plate 420 and the camera lenses 412A-B (refer to FIG. 7). The thermal seals 416A-B are affixed directly to the front surface of the heater plate 420 so as to provide a thermal buffer between the components behind the heater plate 420, the case 402, and the external environment. As depicted, the heating pad 422 and the heat switch 418 are configured to the back surface of the heater plate 420. In some implementations, as depicted, the heating pad 422 can be affixed directly to the back surface of the heater plate 420 and the heat switch 418 can be affixed directly to the heating pad 422. In other implementations (not depicted), the heat switch 418 and the heating pad 422 can be affixed directly to the heater plate 420, proximate to each other.

The heater assembly 800 is advantageous for several reasons. First, placement of the heating pad 422 and the windows 414A-B on the back surface of the heater plate 420 can provide for constant heat transfer to an exterior side of the windows 414A-B so as to avoid external fogging. Second, this configuration can provide for heat transfer to an interior side of the windows 414A-B as well, to the sealed environment between the camera lenses 412A-B and the windows 414A-B so as to mitigate internal fogging. Third, heat can be transferred to both the interior and exterior sides of the windows 414A-B simultaneously to avoid fogging as a result of any change in external environment conditions. Fourth, placement of the heating pad 422 and the heat switch 418 on a same surface of the heater plate 420 can provide for more accurate readings of real-time temperature values of the heating pad 422 and/or the windows 414A-B. Other advantages are apparent based on the description throughout this disclosure. Moreover, the heater assembly 800 can be reconfigured into the heater assembly 400, 500, 600, 700 or any other heater assembly described herein (e.g., refer to FIG. 9).

Figure 9:
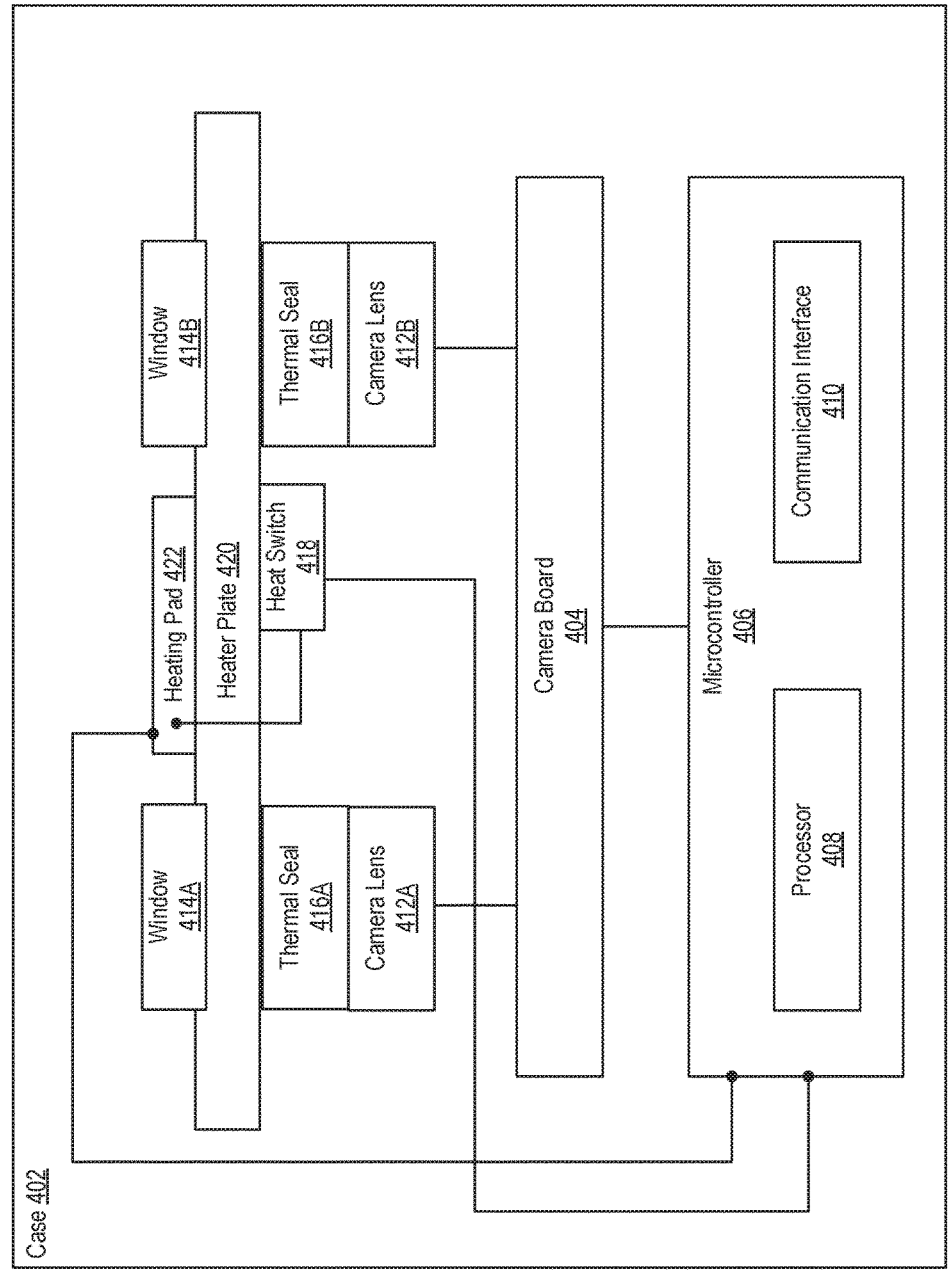

In FIG. 9, a heater assembly 900 is depicted. The heater assembly 900 performs/functions similarly and compromises the same components as described throughout this disclosure (e.g., refer to FIG. 4). In the heater assembly 900, the windows 414A-B are affixed to the front surface of the heater plate 420. The thermal seals 416A-B are affixed directly to the back surface of the heater plate 420, between the heater plate 420 and the camera lenses 412A-B. As depicted, the heating pad 422 is positioned on the front surface of the heater plate 420 and the heat switch 418 is positioned on the back surface of the heater plate 420.

The configuration depicted in FIG. 9 is advantageous for several reasons. First, placement of the heating pad 422 and the windows 414A-B on a same surface of the heater plate 420 provides for constant heat transfer from the heater plate 420 to the windows 414A-B so as to mitigate fogging and maintain a constant condition of the windows 414A-B. Second, placement of the windows 414A-B on the front surface of the heater plate 402 can provide for easier servicing, cleaning, replacement, and/or other maintenance of the windows 414A-B. For example, if the user applies a thin layer of chemical anti-fog treatment to the windows 414A-B, the configuration depicted in FIG. 9 is advantageous to provide for easier and faster access to the windows 414A-B to apply the treatment. Third, placement of the thermal seals 416A-B against the back surface of the heater plate 420 can preserve the thermal seals 416A-B for a longer period of time such that they can function properly for longer. As a result, the thermal seals 416A-B can be serviced or replaced less frequently. Fourth, this configuration can prevent dew or fog from building up on the camera lenses 412A-B since the thermal seals 416A-B are positioned flush between the back surface of the heater plate 420 and the camera lenses 412A-B. As a result, cleaning or other maintenance of the camera lenses 412A-B can be reduced.

Still referring to FIG. 9, in other implementations (not depicted), the windows 414A-B can be positioned against the back surface of the heater plate 420 and the thermal seals 416A-B can be positioned against an interior side of the windows 414A-B, between the windows 414A-B and the camera lenses 412A-B. In yet other implementations, the thermal seals 416A-B can be positioned against the back surface of the heater plate 420 and the windows 414A-B can be positioned between the thermal seals 416A-B and the camera lenses 412A-B. Additionally, in some implementations, the heating pad 422 and the heat switch 418 can be positioned on the front surface of the heater plate 420. In other implementations, the heating pad 422 and the heat switch 418 can be positioned on the back surface of the heater plate 420. In yet other implementations, the heat switch 418 can be positioned on the front surface of the heater plate 420 and the heating pad 422 can be positioned on the back surface of the heater plate 420. Additional advantages are apparent based on the description throughout this disclosure. Moreover, the heater assembly 900 can be reconfigured into any of the heater assemblies described herein (e.g., refer to FIGS. 4-8).

Figure 10:
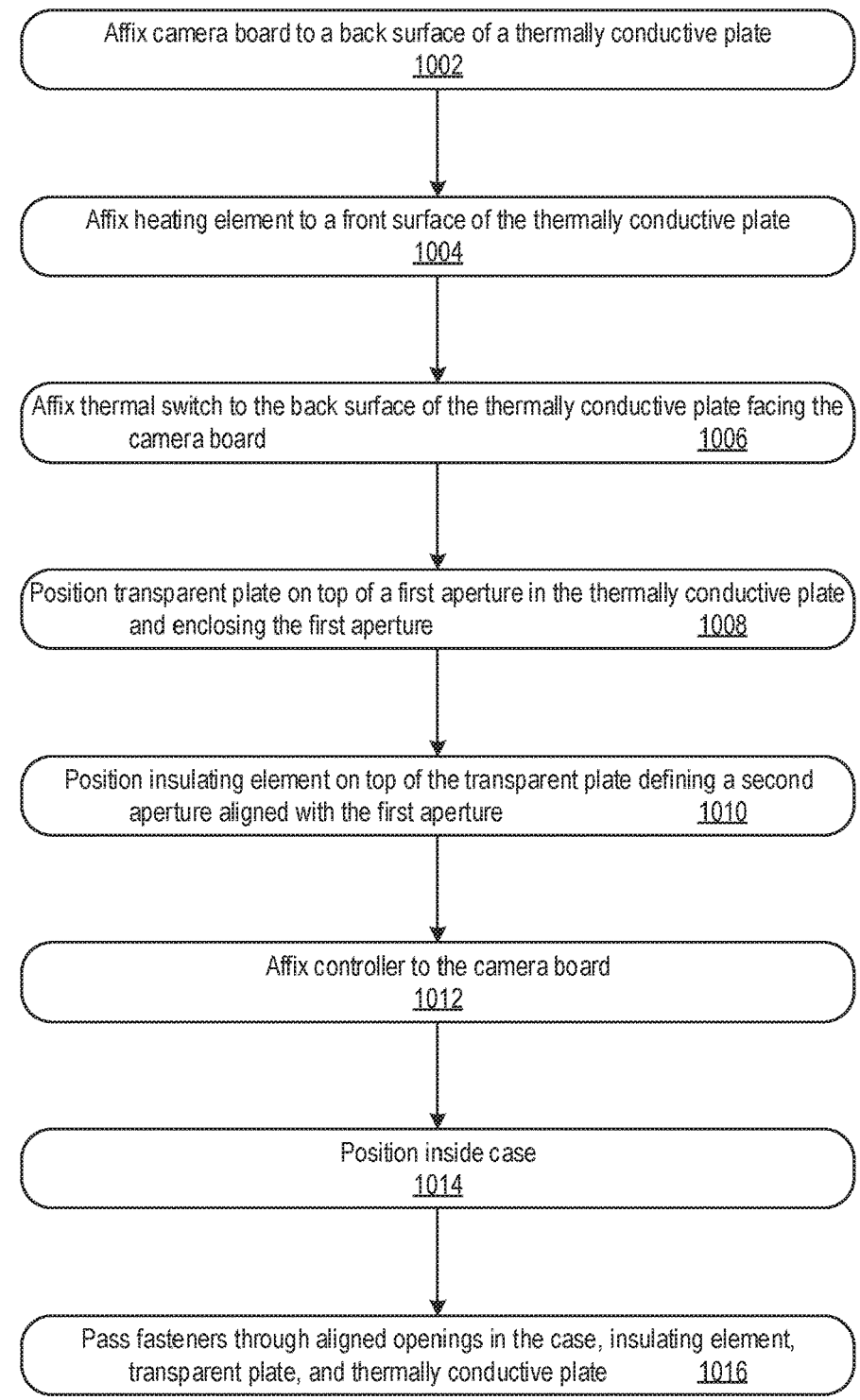
FIG. 10 is a flowchart for assembling the heater assembly.

FIG. 10 is a flowchart for assembling the heater assembly described herein. Process 1000 can be used to assembly the heater assembly 400, as depicted in FIG. 4. The process 1000 can also be adapted to assemble any other heat assembly depicted and described throughout this disclosure (e.g., refer to FIGS. 5-9). In some implementations, a user can assemble the heater assembly using the process 1000. In other implementations, a machine can assemble the heater assembly using the process 1000. The process 1000 can be used to manufacture the heating assembly. The process 1000 can also be used to change out and/or service components of the heater assembly, as described throughout this disclosure.

Referring to FIG. 10, a camera board (e.g., the camera board 206 in FIG. 2) can be affixed to a back surface of a thermally conductive plate (e.g., the heating subsystem 204 in FIG. 2) in step 1002 (e.g., refer to FIGS. 2, 4-9). In step 1004, a heating element (e.g., the heating element 104 in FIG. 1 and the heating pad 422 in FIGS. 4-9) can be affixed to a front surface of the thermally conductive plate (e.g., the thermally conductive plate 102 in FIG. 1 and the heater plate 420 in FIGS. 4-9). A thermal switch (e.g., the thermal switch 108 in FIG. 1 and the heat switch 418 in FIGS. 4-9) can be affixed to the back surface of the thermally conductive plate facing the camera board in step 1006. As described throughout this disclosure, the thermal switch can be screwed onto the thermally conductive plate to allow for ease in removing and/or servicing the thermal switch. Additionally and/or alternatively, the components described herein can be affixed to each other using screws, fasteners, adhesives, or other types of connecting means that do not require soldering. This assembling provides for easier and faster access to components of the heater assembly.

In step 1008, a transparent plate (e.g., the transparent plate 106 in FIG. 1 and the windows 414A-B in FIGS. 4-9) can be positioned in front of a first aperture (e.g., the oblong opening 116 in FIG. 1) in the thermally conductive plate so as to enclose the first aperture. An insulating element (e.g., the insulating element 110 in FIG. 1 and the thermal seals 416A-B in FIGS. 4-9) can be positioned on a front surface of the transparent plate, wherein the insulating element defines a second aperture (e.g., the aperture 112 in FIG. 1) that is aligned with the first aperture of the thermally conductive plate. As described throughout this disclosure, alignment of the first and second apertures provides for an unobstructed field of view for a camera lens. Next, in step 1012, a controller (e.g., the microcontroller 406 in FIGS. 4-9) can be affixed to the camera board. Step 1012 can be performed before or after any of the steps previously described in the process 1000.

In step 1014, the heater assembly described in the previous steps can be positioned inside a case (e.g., the case 402 in FIGS. 4-9), between a front panel and a rear case (e.g., the front panel 202 and the rear case 212 in FIG. 2). Once positioned therein, fasteners (e.g., the fasteners 310A-N in FIG. 3) can be passed through aligned openings (e.g., the openings 114A-N, 118A-N, and 120A-N in FIG. 1) in the case, the insulating element, the transparent plate, and the thermally conductive plate in step 1016. As a result, the components of the heater assembly can be affixed to each other and held in place within the case. The steps 1002-1014 described in the process 1000 can be performed in any order.

In some implementations, not all steps are necessary or required in order to assemble a user's desired heater assembly.

Figure 11:
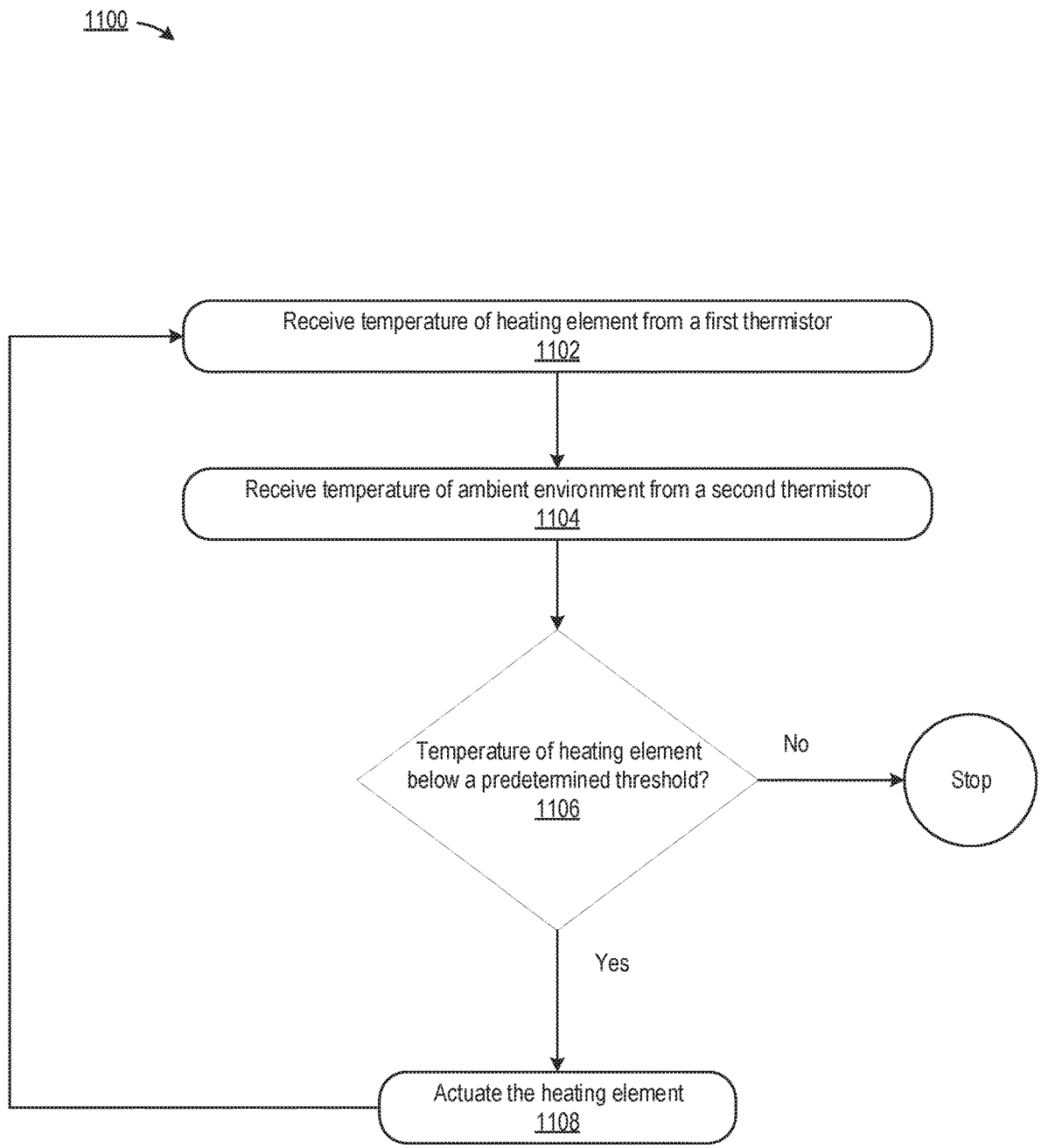
FIG. 11 is a flowchart for operating the heater assembly.

FIG. 11 is a flowchart for operating the heater assembly described herein. Process 1100 can be performed by the processor 408 of the microcontroller 406 (e.g., refer to FIGS. 4-9). In some implementations, the process 1100 can be performed by a controller and/or computing device (e.g., cellphone, laptop, computer, tablet, etc.) in wired and/or wireless communication with one or more components of the heater assembly described herein. In some implementations, the process 1100 can be automatically executed/performed in real-time. In other implementations, the process 1100 can be executed/performed at predetermined times. For example, the process 1100 can be performed before the heater assembly moves from one environment to another. The process 1100 can be used to predict temperatures and prepare the heater assembly to prevent fogging once the heater assembly actually moves between the different environments. In yet other implementations, the process 1100 can be executed upon notification received from a user device (e.g., cellphone, laptop, computer, tablet, etc.). For example, a user can view footage from the camera lens in real-time while the heater assembly is moving between different environment conditions and upon noticing the camera lens fogging up or becoming unclear, the user, via the user device, can send a notification to the microcontroller to execute the process 1100 and mitigate fogging.

Referring to FIG. 11, in step 1102, the processor can receive a temperature of a heating element (e.g., the heating pad 422 in FIGS. 4-9) from a first thermistor. The first thermistor can be part of a thermal switch (e.g., the heat switch 418). In other implementations, the first thermistor can be an additional component that is affixed to and/or positioned proximate to the heating element. The thermistor can also be any type of temperature-sensing device.

In some implementations, the processor can receive a continuous stream of temperature values of the heating element in real-time. This can be beneficial in order to constantly moderate an amount of heat generated by the heating element in order to maintain a steady defogged temperature at a transparent plate (e.g., the windows 414A-B in FIGS. 4-9). In other implementations, the processor can receive temperature values of the heating element in timed intervals. For example, temperature values can be obtained every five minutes. In some implementations, temperature values can be obtained before the heater assembly described herein enters a different environment, immediately after entering the different environment, and at a predetermined amount of time after staying in the different environment. In some implementations, the processor can communicate with a tracking device/system that maps where the heating assembly is located in real-time. Based on communication about real-time locations of the heater assembly, the processor can determine how often and when to request temperature values of the heating element. As mentioned, the processor can automatically receive the temperature values. In other implementations, the processor can request one or more temperature values from the thermal switch and/or the first thermistor.

Still referring to FIG. 11, in step 1104, the processor can receive a temperature of an ambient environment from a second thermistor. In some implementations, the second thermistor can be the same as the first thermistor. In other implementations, the processor can communicate with one or more temperature-reading sensors that are positioned on an external side of the case (e.g., the case 402 in FIGS. 4-9)

enclosing the heater assembly. In yet other implementations, the one or more temperature-reading sensors can be located within the ambient environment and can communicate wirelessly with the processor. For example, the heater assembly can be attached to a forklift in a warehouse environment and the warehouse can include one or more climate zones. Each climate zone can include temperature-reading sensors in order to record and maintain certain climate conditions. The processor in the heater assembly can communicate wirelessly with the temperature-reading sensors in each climate zone to determine a temperature of the climate zone before the forklift with the heater assembly moves into that climate zone. As a result, the processor can predict how to prepare and actuate components of the heater assembly so that the transparent plate (e.g., the windows 414A-B in FIGS. 4-9) does not fog up upon entering the climate zone. Additionally, the processor can communicate with the sensors in each climate zone while the heater assembly is located in the climate zone so as to maintain and/or moderate how much heat is generated and applied to the transparent plate.

Once the processor receives the temperature value(s) of the heating element and the temperature value(s) of the ambient environment, the processor can determine whether the temperature of the heating element is below a predetermined threshold value in step 1106. In implementations where the heating element is intended to prevent fogging of an inside of the transparent plate and there is an extreme decrease in temperature in the external environment, if the temperature of the heating element is above a predetermined threshold, then the inside of the transparent plate can already be receiving enough heat to prevent fogging therein. Therefore, the process 1100 can stop. If, on the other hand, the temperature of the heating element is below the predetermined threshold temperature to prevent fogging when the heater assembly moves into or is in the external environment with the extreme decreased temperature, then the processor can actuate the heating element in step 1108 in order to increase an amount of heat generated by the heating element. In some implementations, the processor can communicate directly with the heating element in order to actuate (e.g., if it is turned off) or increase the amount of power provided to the heating element to increase the amount of heat generated. In other implementations, the processor can communicate with the thermal switch, and the thermal switch can be coupled to the heating element and configured to actuate the heating element or increase the amount of power provided to the heating element. As described herein, the heating element can also be coupled to a power source and the processor and/or the thermal switch can be configured to couple or decouple the heating element from the power source, based at least in part on the processor's determination in step 1106.

Still referring to step 1106, in implementations where the heating element is intended to prevent fogging or defog an exterior side of the transparent plate and there is a decrease in temperature of the external environment, if the temperature of the heating element is above the predetermined threshold temperature to ensure defogging or no fogging, then the processor can determine that the heating element does not need to generate additional heat in order to mitigate fogging. In some implementations, the processor can decouple the heating element from the power source upon making this determination. Decoupling can be beneficial in order to save power and energy, thereby increasing a lifespan and optimal use of the heating element as well as the power source. This can reduce servicing, maintenance, and/or replacement costs and time. Moreover, decoupling can be beneficial in order to take advantage of energy (e.g., heat) that has been generated by the heating element and stored in the thermally conductive plate. The stored energy can be used to mitigate fogging and/or maintain the transparent plate at a constant temperature for a predetermined amount of time (e.g., for a duration of time that the heater assembly is located in a particular external environment) or until one or more temperature values change in the external environment and/or the heating element (e.g., refer to steps 1102 and 1104). Additionally and/or alternatively, if the processor determines that the temperature of the heating element is not below the predetermined threshold temperature in step 1106, then the processor can maintain a current amount of power that is supplied to the heating element so that the heating element maintains a constant generation of heat.

Still referring to step 1106, if the temperature of the heating element is below the predetermined threshold temperature value, the processor can actuate the heating element (e.g., if it is decoupled from the power source and/or turned off or not generating any heat) and/or provide additional power to the heating element such that the heating element generates more heat to raise the temperature above the predetermined threshold value (step 1108), as previously described.

As depicted, upon completing the step 1108, the process 1100 can return to step 1102 and repeat. In other implementations, the process 1100 can stop after step 1108. In yet other implementations, the process 1100 can repeat after the processor determines that the temperature of the heating element is above the predetermined threshold value in step 1106. Moreover, the predetermined threshold value can be determined by a user at a computing device (e.g., laptop, cellphone, tablet, etc.). In other implementations, the predetermined threshold value can be determined by the processor and/or an external computer or computing system and based at least on historic temperature values of the heating element and different external environments.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An anti-fogging apparatus for a camera assembly comprising:
a camera affixed to a substrate;
a thermally conductive plate having a back surface facing the substrate and a front surface opposing the back surface, the thermally conductive plate positioned in front of the substrate and defining a first aperture aligned with a lens of the camera;
a transparent plate positioned in front of the lens of the camera such that the transparent plate is aligned with the first aperture;
an insulating element positioned in front of the transparent plate and defining a second aperture that is aligned with the first aperture;
a heating element affixed to the thermally conductive plate;
a case enclosing the camera, the thermally conductive plate, the transparent plate, the insulating element, and the heating element;
a first fastener passing through a first opening in the case and a first opening in the thermally conductive plate that align with each other; and
a second fastener passing through a second opening in the case and a second opening in the thermally conductive plate that align with each other.

2. The apparatus of claim 1, wherein the first fastener passes through a first opening in the insulating element and a first opening in the transparent plate.

3. The apparatus of claim 1, wherein the second fastener passes through a second opening in the insulating element and a second opening in the transparent plate.

4. The apparatus of claim 1, wherein the heating element is affixed to the back surface of the thermally conductive plate facing the substrate.

5. The apparatus of claim 1, wherein the heating element is affixed to the front surface of the thermally conductive plate.

6. The apparatus of claim 1, further comprising a thermal switch affixed to the back surface of the thermally conductive plate facing the substrate.

7. The apparatus of claim 1, further comprising a thermal switch affixed to the front surface of the thermally conductive plate.

8. The apparatus of claim 1, wherein the insulating element is a silicone pad.

9. The apparatus of claim 1, wherein the insulating element is a silica desiccant pack.

10. The apparatus of claim 1, wherein the heating element is a heating pad.

11. The apparatus of claim 1, wherein the thermally conductive plate is aluminum.

12. The apparatus of claim 1, further comprising a thermal switch to detect a temperature of the heating element, the thermally conductive plate, or an environment inside the case, the thermal switch coupling and decoupling the heating element to a power source based, at least in part, on the detected temperature of at least the heating element and the environment.

13. The apparatus of claim 12, wherein the thermal switch comprises a first thermistor for detecting a temperature of the heating element and a second thermistor for detecting a temperature of the environment inside the case.

14. The apparatus of claim 12, wherein the thermal switch is affixed to the back surface of the thermally conductive plate with a fastener.

15. The apparatus of claim 1, wherein the lens of the camera is positioned within the first aperture in the thermally conductive plate.

16. The apparatus of claim 1, wherein the insulating element comprises a gasket positioned between the thermally conductive plate and the case, wherein the second aperture is in the gasket.

17. The apparatus of claim 1, wherein a tallest part of the transparent plate is higher than a tallest part of the first aperture.

18. An anti-fogging apparatus for a camera assembly comprising:
a camera affixed to a substrate;
a thermally conductive plate having a back surface facing the substrate and a front surface opposing the back surface, the thermally conductive plate positioned in front of the substrate and defining a first aperture aligned with a lens of the camera;
a transparent plate positioned in front of the thermally conductive plate such that the transparent plate covers said first aperture;
an insulating element positioned in front of the transparent plate and defining a second aperture that is aligned with the first aperture;
a heating element affixed to the thermally conductive plate;
a thermal switch affixed to the thermally conductive plate;
a case enclosing the camera, the thermally conductive plate, the transparent plate, the insulating element, and the heating element; and
a fastener passing through an opening in the case, an opening in the insulating element, an opening in the transparent plate, and an opening in the thermally conductive plate that align with each other.

19. An anti-fogging apparatus for a camera assembly comprising:
a camera affixed to a substrate;
a thermally conductive plate having a back surface facing the substrate and a front surface opposing the back surface, the thermally conductive plate positioned in front of the substrate and defining a first aperture aligned with a lens of the camera;
a transparent plate positioned in front of the lens of the camera such that the transparent plate is aligned with the first aperture;
an insulating element positioned in front of the transparent plate and defining a second aperture that is aligned with the first aperture;
a heating element affixed to the thermally conductive plate;
a case enclosing the camera, the thermally conductive plate, the transparent plate, the insulating element, and the heating element; and
a fastener passing through an opening in the case, an opening in the insulating element, an opening in the transparent plate, and an opening in the thermally conductive plate that align with each other.

\* \* \* \* \*